United States Patent [19]

Saito et al.

[11] Patent Number: 4,588,962

[45] Date of Patent: May 13, 1986

[54] DEVICE FOR DISTRIBUTING AND COMBINING MICROWAVE ELECTRIC POWER

[75] Inventors: Toshiyuki Saito, Kawasaki; Yasuyuki Tokumitsu, Isehara; Naofumi Okubo, Kawasaki; Yoshimasa Daido, Yokohama; Hiroshi Kurihara, Tokyo, all of Japan

[73] Assignee: Fujitsu Limited, Kawasaki, Japan

[21] Appl. No.: 498,658

[22] Filed: May 27, 1983

[30] Foreign Application Priority Data

| | | | |
|---|---|---|---|
| May 31, 1982 | [JP] | Japan | 57-92389 |
| Jun. 14, 1982 | [JP] | Japan | 57-101783 |
| Jun. 28, 1982 | [JP] | Japan | 57-109911 |
| Jun. 29, 1982 | [JP] | Japan | 57-110627 |

[51] Int. Cl.[4] .......... H03F 3/60

[52] U.S. Cl. .......... 330/286; 333/137; 330/295

[58] Field of Search .......... 330/286, 295; 333/81 B, 333/113, 122, 137, 157, 239, 125

[56] References Cited

U.S. PATENT DOCUMENTS

| | | | |
|---|---|---|---|
| 2,650,985 | 9/1953 | Rust et al. | 343/786 |
| 3,311,917 | 3/1967 | Thourel | 343/754 |
| 3,518,789 | 6/1970 | Hoffman | 446/445 |
| 3,732,508 | 5/1973 | Ito et al. | 333/21 R |
| 4,282,491 | 8/1981 | MacMaster et al. | 330/286 |
| 4,283,685 | 8/1981 | MacMaster et al. | 330/286 |
| 4,291,278 | 9/1981 | Quine | 330/286 |

FOREIGN PATENT DOCUMENTS

| | | |
|---|---|---|
| 962181 | 4/1957 | Fed. Rep. of Germany . |
| 1498639 | 10/1967 | France . |
| 577939 | 6/1946 | United Kingdom . |

OTHER PUBLICATIONS

"6 GHz 6 QAM MIC Modulator with Phase Linearity Improved", T. Takano et al., 1980 *IEEE MTT-S International Microwave Symposium Digest*, pp. 114–116.

*Primary Examiner*—James B. Mullins
*Assistant Examiner*—Steven J. Mottola
*Attorney, Agent, or Firm*—Staas & Halsey

[57] ABSTRACT

A device for distributing and combining microwave electric power which is used, for example, in a high power microwave amplifier and combines or distributes microwave electric power between a first microwave path such as a standard waveguide and a plurality of second microwave paths such as a plurality of waveguides or MIC transmission lines. The device comprises a horn whose throat portion is coupled to the first microwave path, a oversized waveguide coupled to the opening portion of the horn at one end and coupled to the plurality of the second microwave paths, and, for example, a dielectric lens, or one or more reflectors, for uniformalizing the phases of the microwave signals distributed by the horn or for adjusting the phases of the microwave signals output from the second microwave paths.

113 Claims, 32 Drawing Figures

DEVICE FOR DISTRIBUTING AND COMBINING MICROWAVE ELECTRIC POWER

BACKGROUND OF THE INVENTION (1) Field of the Invention

The present invention relates to a device for distributing and combining microwave electric power between a single waveguide and a plurality of microwave transmission paths.

(2) Description of the Prior Art

In recent years, attempts have been made to use semiconductor amplifier elements such as gallium-arsenic (GaAs) field effect transistors (FET's) instead of conventional traveling-wave tubes, in order to amplify signals in the microwave band. The semiconductor amplifier element, however, has an output power of several watts at the greatest. When it is necessary to amplify a high frequency signal with a great deal of electric power, such elements must be operated in parallel. For this reason, it is accepted practice to distribute input signals in the microwave band into a plurality of channels using a microwave distributor, to amplify the signals of each channel by the above-mentioned semiconductor amplifier element, and to combine the amplified output signals of each of the channels into a signal of one channel using a microwave combiner, thereby obtaining a high frequency at high power. The power, however, is lost when phases of the microwave signal distributed by the microwave distributor are not in agreement, or when the microwave signals are not combined in phase by the microwave combiner. It is, therefore, desired that phases of microwave signals be uniformly distributed in the microwave distributor and in the microwave combiner. It is also necessary that the distributor and the combiner itself lose as little electric power as possible.

FIG. 1A shows a conventional microwave power amplifier, in which a high-frequency input signal IN is divided into four signals using three 3-dB hybrid circuits, the divided input signals are individually amplified by four solid state amplifier elements 2 to 5, and the amplified output signals are combined by hybrid circuits 6, thereby obtaining an amplified high-frequency output signal OUT. In the amplifier of FIG. 1A, when the microwave electric power is distributed from a single waveguide (WG) to a plurality of transmission paths or is combined in the opposite direction, branching points which branch at a ratio of 1:2 or combining points must be provided at each of the places as denoted by reference numeral 1 in FIG. 1B. The distribution of electric power from a single waveguide 7 directly into many transmission paths (such as waveguides) 8-1, 8-2, - - - , or vice versa, is not possible. In the conventional amplifier of FIG. 1A, each of the hybrid circuits 1 or 6 consists of a magic T as shown in FIG. 1C. Therefore, if the magic T's are used at a plurality of branching points, the whole amplifier becomes very bulky and complex in construction. Further, the amplifier element and the waveguide are usually connected via a structure which consists of a connection of a waveguide—a ridge waveguide—an amplifier element with strip lines that serve as input and output terminals—a ridge waveguide—a waveguide. Therefore, the construction is complicated and, moreover, the reliability is not good since the strip lines are connected to the ridge waveguides simply in a pressed manner.

SUMMARY OF THE INVENTION

It is an object of the present invention to provide a device for distributing and combining microwave electric power, which is small in size, simple in construction, and highly stable.

It is another object of the present invention to provide a device for distributing and combining microwave electric power between a single waveguide and a plurality of microwave transmission paths which is capable of uniformalizing the phase distribution of microwave electric power when it is to be distributed or combined.

It is still another object of the present invention to provide a device for distributing and combining microwave electric power which has a low transmission loss.

According to the present invention, there is provided a device for distributing and combining microwave electric power between a first microwave path and a plurality of second microwave paths comprising: a horn whose throat portion is coupled to the first microwave path; an oversized waveguide coupled to the opening portion of the horn at one end, another end of the oversized waveguide being coupled to the plurality of second microwave paths; and a phase compensating means for uniformalizing the phases of the microwave signals distributed by the horn or for adjusting the phases of the microwave signals output from the plurality of second microwave paths, the phase compensating means being arranged at the portion from the horn to the oversized waveguide.

DESCRIPTION OF THE PREFERRED EMBODIMENTS

Embodiments of the present invention will now be described with reference to the drawings.

Figure 1A:
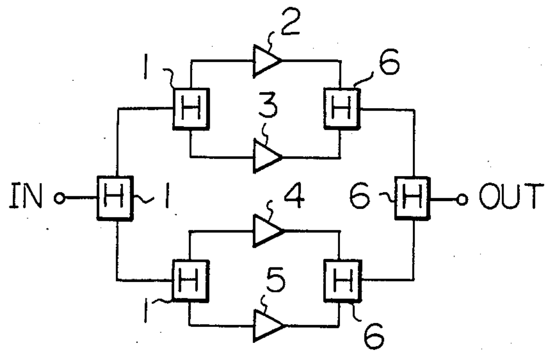
Fig. 1A PRIOR ART
FIG. 1A is a block circuit diagram of a microwave amplifier which uses a conventional distributor and a conventional combiner of microwave electric power.
Figure 1B:
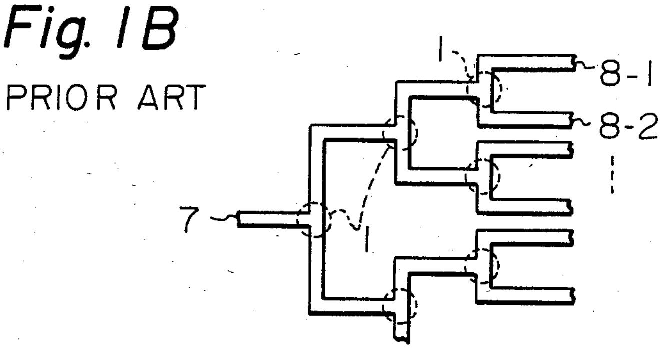
Fig. 1B PRIOR ART
FIG. 1B is a diagram of a conventional distributor or combiner used in the amplifier of FIG. 1A.
Figure 1C:
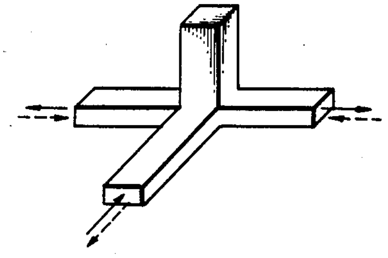
Fig. 1C PRIOR ART
FIG. 1C is a perspective view of a magic T used in a conventional distributor or combiner of FIG. 1B.
Figure 2:
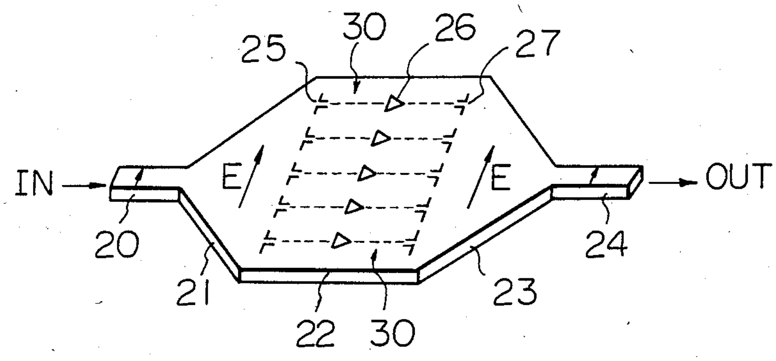
FIG. 2 is a perspective view of a microwave amplifier which uses a distributor and a combiner as an embodiment of the present invention.

FIG. 2 illustrates a microwave amplifier which uses a distributor and a combiner according to the present invention. In FIG. 2, reference numeral 20 denotes a waveguide WG on the input side, 21 denotes a distributing electromagnetic horn (E-planee horn), 22 denotes an oversized waveguide which has a broad E-plane, 23 denotes a combining electromagnetic horn (E-plane horn), and 24 denotes a waveguide on the output side. In the oversized waveguide 22 a plurality of unit amplifiers 30 is arranged, each unit amplifier being made up of a dipole antenna 25 of the input side, a solid amplifier 26 constructed in the form of a microwave integrated circuit (MIC) employing one or more stages of solid amplifier elements, and a dipole antenna 27 on the output side.

Figure 3:
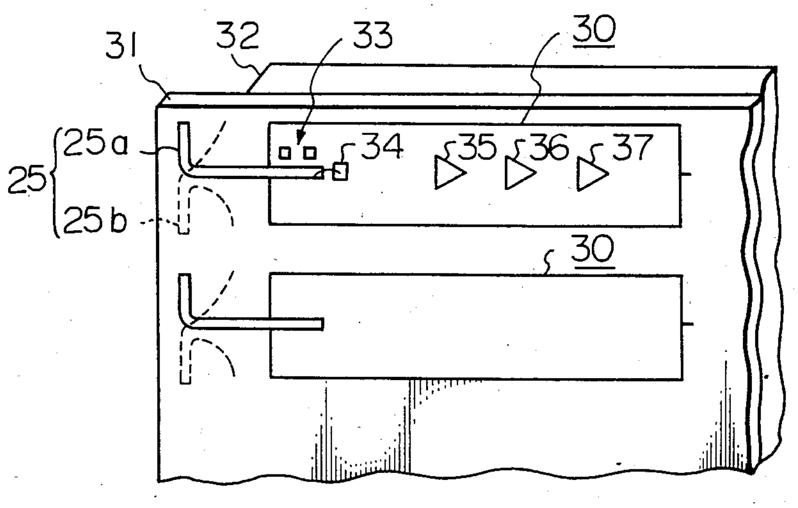
FIG. 3 is a perspective view of a part of the microwave amplifier of FIG. 2.
Figure 4:
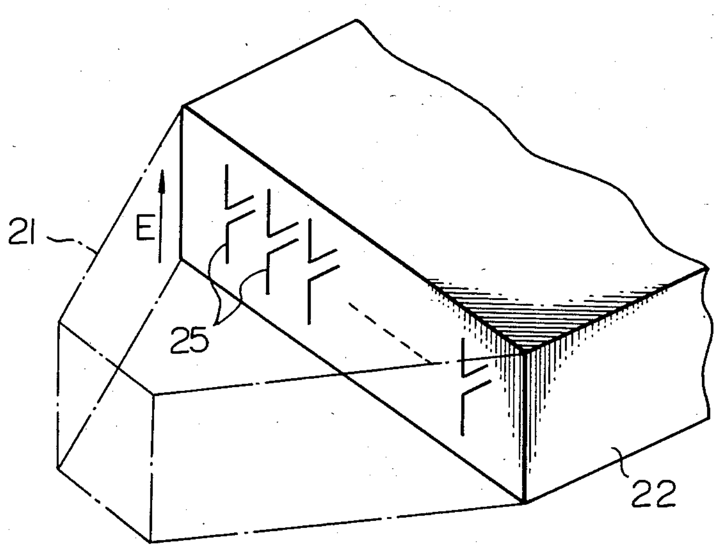
FIG. 4 is a partial perspective view of another embodiment of the present invnetion.

FIG. 3 illustrates a concrete example of unit amplifier 30, in which reference numeral 31 denotes a dielectric substrate, and 32 denotes a metal block on the back surface thereof (the metal block is secured to the bottom of the waveguide 22). One side (segment) of the dipole antenna 25 having an overall length of λ/2, is formed by a pattern 25*a* on the front surface, and the other side thereof is formed by a pattern 25*b* on the back surface. Reference numeral 33 denotes a matching circuit, wherein small squares represent electrically conductive patterns for adjusting the impedance, these patterns being wire-bonded to a base portion of the antenna according to need. Reference numeral 34 denotes an amplifier element (such as an FET) with its gate being connected to the pattern 25*a*. The source of the FET 34 is grounded, and its drain is connected to an amplifier element 35 of the next stage. Reference numeral 36, 37, - - - denote amplifier elements of the subsequent stages, and the output of the final stage is connected to the antenna 27 of the output side. When the electromagnetic horn 21 is an E-plane horn, segments of the antennas 25 (the same holds true for the antennas 27) are arrayed along the direction of electric field E as shown in FIG. 2, and the antennas are all arrayed in series in the direction of the electric field. When the electromagnetic horn 21 is an H-plane horn, the antenna elements are turned by 90° toward the direction of electric field E as shown in FIG. 4, whereby the antennas are all arrayed in a, in parallel in the direction of electric field E.

Figure 5A:
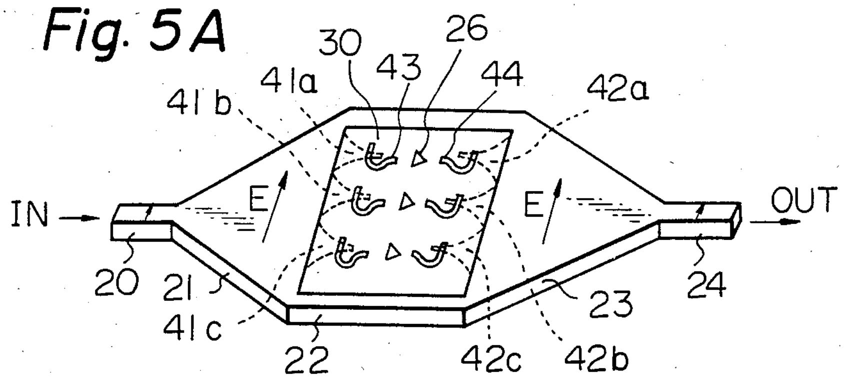
FIG. 5A is a perspective view of a microwave amplifier which uses a distributor and a combiner as still another embodiment of the present invention.
Figure 5B:
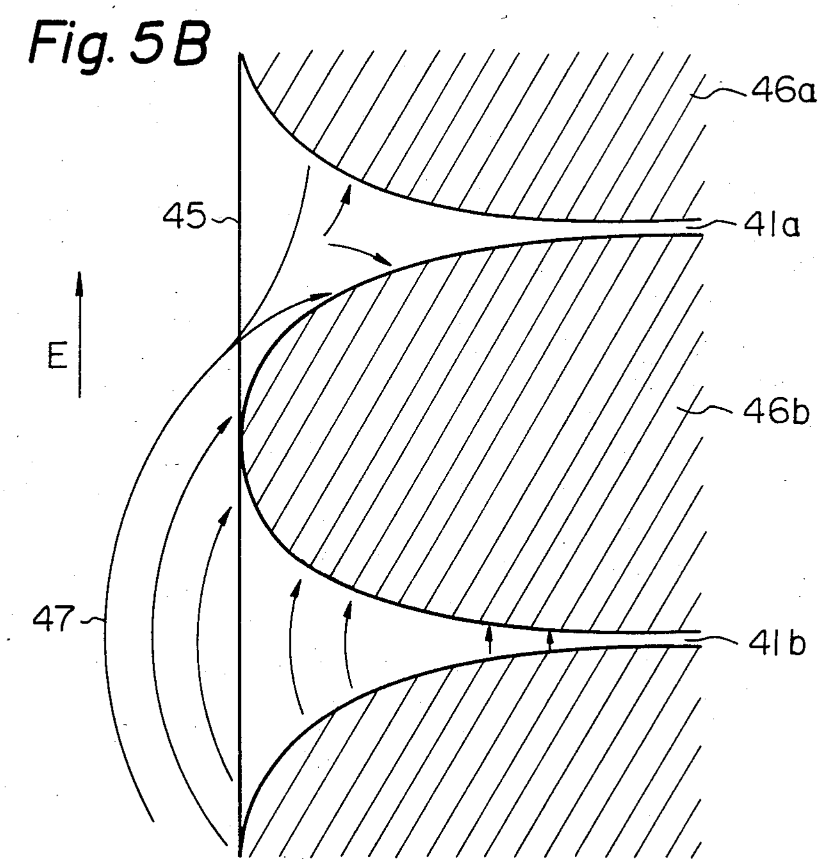
FIG. 5B is an enlarged view of a part of the microwave amplifier of FIG. 5A.

FIG. 5A illustrates a microwave amplifier using a distributor and a combiner as another embodiment of the present invention in which slot antennas are employed as small antennas. Namely, a unit amplifier 30 comprises slot antennas 41, 42 on the input and output sides, an amplifier 26, and slot/strip line converters 43, 44. Slot antennas 41*a*, 41*b*, 41*c*, - - - and 42*a*, 42*b*, 42*c*, - - - in the input side and output side are arrayed in series along the direction of electric field E. With this construction, electromagnetic waves emitted from an antenna 41*b* are not mixed into the electromagnetic waves emitted from the other antenna 41*a* as shown in FIG. 5B, so that an isolation effect between the antennas is performed. In FIG. 5B, reference numeral 45 denotes a dielectric substrate, and 46*a*, 46*b*, - - - denote electrically conductive patterns which form horned slots for antennas 41*a*, 41*b*, - - - . Converters 43, 44 of FIG. 5A comprise electrically conductive patterns formed on the opposite surface of the substrate. It should be noted that the above-mentioned isolation effect results from the fact that the electric lines of force 47 of the slot antenna 41*b* is evenly absorbed by the conductors 46*a*, 46*b* constituting the slot antenna 41*a*. Like the case of FIG. 4, the slot antennas may be arrayed in a direction at right angle of the direction of electric field, that is, in parallel with the direction of electric field. In this case, however, the isolation effect cannot be expected.

In the above-mentioned microwave amplifier, a high-frequency input is distributed into a plurality of input antennas by the distributing electromagnetic horn, and outputs amplified by amplifiers coupled to the input antennas are combined into one output by the output antennas and the combining electromagnetic horn. Therefore, the high power microwave amplifier can be realized in a compact and simplified construction without requiring hybrid devices such as magic T's. Furthermore, a reliable connection between the amplifiers and the waveguides is obtained.

Figure 6:
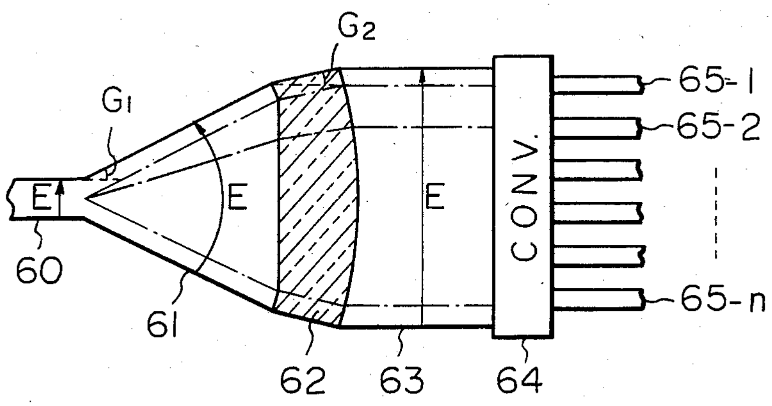
FIG. 6 is a diagram of a distributor or a combiner as still another embodiment of the present invention.

FIG. 6 is a diagram which illustrates still another embodiment of the present invention, in which reference numeral 60 denotes a waveguide (WG) and reference numerals 65-1, 65-2, - - - , 65-n denote a plurality of transmission paths such as MIC's. The microwave electric power is distributed or combined between the waveguide 60 and these transmission paths. Reference numeral 61 denotes an E-plane horn having a uniform thickness which expands the width of the waveguide at an angle $G_1$, 62 denotes a two-dimensional dielectric lens having a uniform thickness made of, for example, polytetrafluoroethylene, polystyrene, or polycarbonate, 63 denotes an oversized waveguide having a broad width, and 64 denotes a converter circuit between the oversized waveguide 63 and the transmission paths 65-1, 65-2, - - - , 65-n. A device for distributing and combining the microwave electric power is constituted by the above-mentioned members. The transmission paths 65-1, 65-2, - - - , 65-n, will be made up of waveguides, coaxial cables, or MIC's. The E-plane horn 61 is widened from the waveguide 60 toward the dielectric lens 62, and the inner electric field E forms a wave surface, i.e., a cylindrical surface emanating from one point.

The dielectric lens 62 is disposed at the joint portion between the E-plane horn 61 and the oversized waveguide 63, and converts the electric field forming the wave surface into a parallel electric field E in the oversized waveguide 63. The dielectric lens 62 has a nearly plane surface on the side of the E-plane horn 61 and an arcuate surface on the side of the oversized waveguide 63. It is necessary to design the lens 62 so that both the phase and amplitude of the electric field E are uniform. Since the dielectric lens 62 has two surfaces and, therefore, has a degree of freedom of 2, it is capable of satisfying this requirement. The angle $G_2$ at both ends of the dielectric lens 62 is not zero but is set at about $G_1/2$. This is because, the curvature of the electric field in the dielectric lens 62 becomes small and the cylinder-plane conversion is smoothly carried out, thereby reducing the reflection of microwave signals. In order to further reduce the reflection, a lens may be arranged between the waveguide 60 and the E-plane horn 61. In this case, a concave lens is used.

The shape of the dielectric lens is determined by the method based on geometrical optics with the following conditions:

(a) The opening area of the dielectric lens is sufficiently larger than the wavelength of the microwave signal.

(b) Only the electromagnetic waves of the fundamental mode of the E-plane horn are incident to the dielectric lens. Therefore, the electromagnetic waves are radiated from the throat portion of the E-plane horn, and have a uniform power distribution with regard to the angle of radiation. Each of the in-phase planes of the electromagnetic waves becomes a cylinder whose central axis penetrates the throat of the E-plane horn.

(c) The path length from the throat portion of the dielectric lens to the cross section of the oversized waveguide at the output side of the dielectric lens is constant regardless of the position along the direction of the electric field E that is a condition of equiphase.

(d) The distribution of the energy of electromagnetic waves within the E-plane horn with regard to the radiation angle is equal to the distribution of the energy of electromagnetic waves within the cross section of the oversized waveguide, that is, a condition of equimagnitude.

Figure 7:
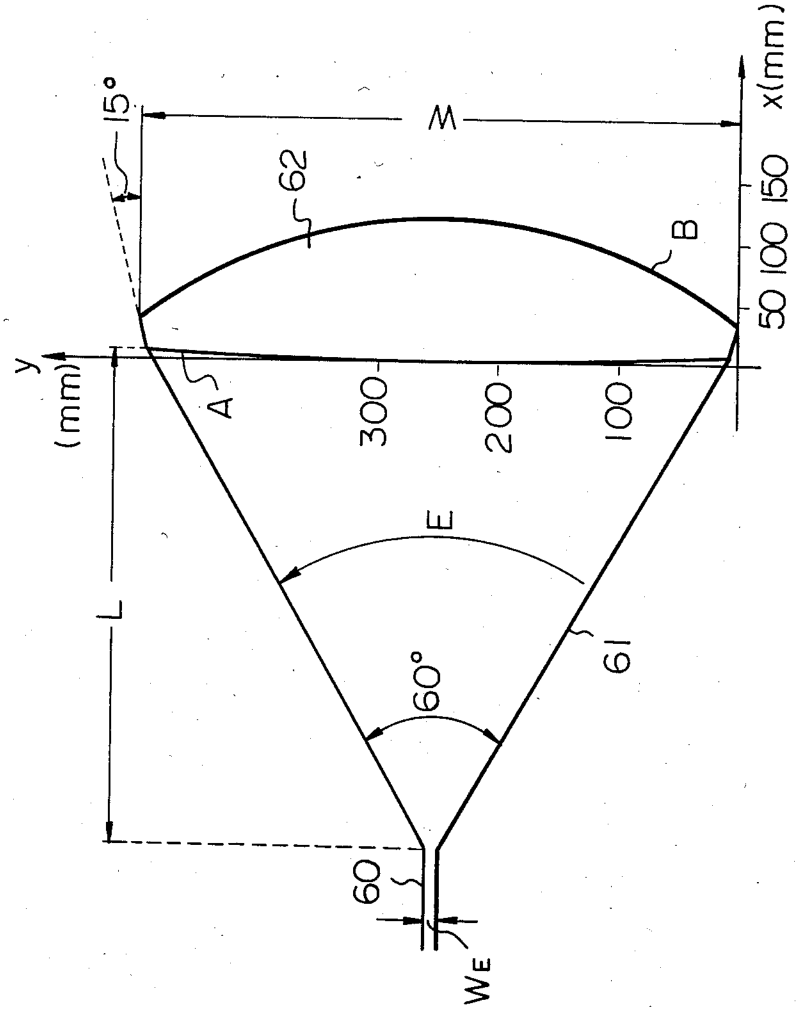
FIG. 7 is a view of an example of the shape of a dielectric lens used in the device of FIG. 6.

FIG. 7 illustrates an example of a shape of the dielectric lens used in the device for distributing and combining microwave electric power of a 14 GHz band, which shape is determined by the above-mentioned conditions. In FIG. 7, the width $W_E$ of a standard waveguide 60 along the electric field E is 7.9 mm and the width $W_H$ thereof along the magnetic field H is 15.8 mm. The opening angle of an E-plane horn 61 is 60°, and the length L of the E-plane horn 61 is about 410 mm. The maximum width W of dielectric lens 62 along the electric field E is 500 mm.

Table 1 shows the coordinates of the points on each of the planes A and B of the dielectric lens 62 shown in FIG. 7. The dielectric constant $\epsilon_r$ of the dielectric lens 62 is assumed to be 2.1.

TABLE 1

| A plane | | B plane | |
|---|---|---|---|
| x (mm) | y (mm) | x (mm) | y (mm) |
| 7.81 | 493.53 | 31.95 | 500.0 |
| 4.40 | 436.29 | 63.70 | 450.0 |
| 2.10 | 373.25 | 93.65 | 387.5 |
| 0.55 | 315.66 | 112.08 | 325.0 |
| 0 | 260.84 | 119.63 | 262.5 |
| 0 | 239.16 | 119.63 | 237.5 |
| 0.55 | 184.34 | 112.08 | 175.0 |
| 2.10 | 126.75 | 93.65 | 112.5 |
| 4.40 | 63.72 | 63.70 | 50.0 |

TABLE 1-continued

| A plane | | B plane | |
|---|---|---|---|
| x (mm) | y (mm) | x (mm) | y (mm) |
| 7.81 | 6.47 | 31.95 | 0 |

Figure 8:
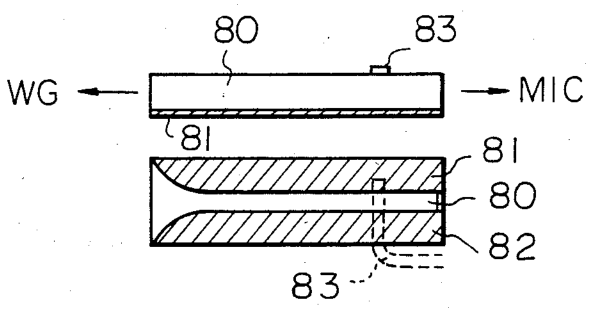
FIG. 8 shows a coupling circuit used in the device of FIG. 7.

FIG. 8 illustrates a detailed structure of a converter circuit 64, i.e., a waveguide/MIC converter circuit used in the device of FIG. 6. The circuit of FIG. 8 is provided in each of the transmission paths 65-1, 65-2, - - - , 65-n. That is, the circuits are arrayed in a plurality in parallel at the end of the waveguide 63. Reference numeral 80 denotes a dielectric substrate. The electromagnetic field is trapped between back-surface patterns 81 and 82 which form a terminal slot line, taken out by a front-surface pattern 83, and input to an amplifier element such as an FET. Other coupling elements such as printed-board antennas may be used for receiving the input signal. In the case of the transmission, it is possible to use the above-mentioned converter circuit. In the case of the oversized waveguide/waveguide conversion, it is only necessary to insert a separator board in the end of the oversized waveguide 63, to suitably obtain the impedance matching.

Figure 9:
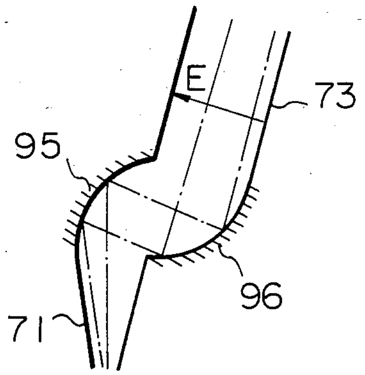
FIG. 9 is a partial schematic view of a distributor or a combiner as still another embodiment of the present invention.

The E-plane horn 61 may be replaced by an H-plane horn which widens in the H-plane. The dielectric lens 62 in FIG. 6 may be replaced by reflectors, as illustrated in FIG. 9. That is, the phase and amplitude of the microwave signal in the oversized waveguide can be maintained constant by two reflectors 95 and 96. Although the device can be constructed using only one reflector, in this case, it becomes difficult to maintain the amplitude constant, and the efficiency decreases as well.

In the embodiments mentioned above, the microwave electric power can be directly distributed at a ratio of 1:n, or can be directly combined at the same ratio. Therefore, the size of the device can be decreased.

Figure 10:
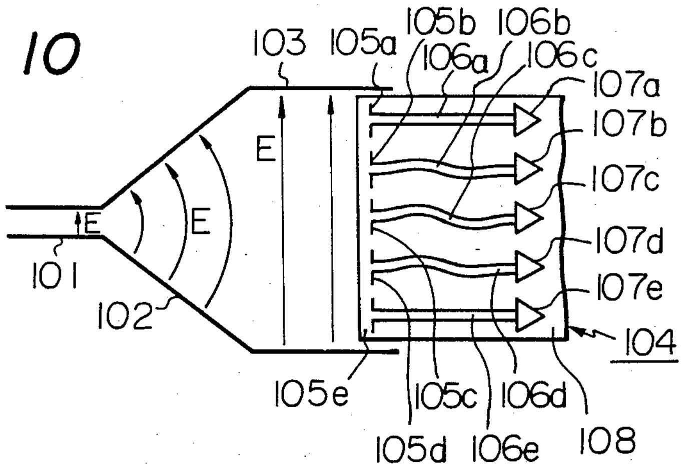
FIGS. 10 and 11 are schematic views of distributors or combiners as still other embodiments of the present invention.

FIG. 10 illustrates a device for distributing microwave electric power in still another embodiment of the present invention. The distributor of FIG. 10 comprises an E-plane horn 102 coupled to a standard waveguide 101 through which microwave signals are introduced, an oversized waveguide 103 coupled to the E-plane horn 102, and an MIC device 104 coupled to transmission paths of the oversized waveguide 103. The MIC device 104 comprises a plurality of waveguide-MIC converters 105*a*, 105*b*, - - - , 105*e* arrayed in the direction of electric field vector, i.e., in the direction of vector E indicated by arrows E in the oversized waveguide 103, MIC transmission paths 106*a*, 106*b*, - - - , 106*e* connected to the waveguide-MIC converters, and microwave amplifiers 107*a*, 107*b*, - - - , 107*e* connected to the MIC transmission paths. The waveguide-MIC converters 105*a*, 105*b*, - - - , 105*e* are composed of dipole antennas formed on a dielectric substrate 108 and linearly arrayed in the widthwise direction of the oversized waveguide, i.e., in the direction of vector E. Further, the MIC transmission paths 106*a*, 106*b*, - - - , 106*e* are composed of microstrip lines formed on the dielectric substrate 108, and their lengths are changed depending upon the positions along the widthwise direction of the oversized waveguide 103. That is, the lengths of the MIC transmission paths 106*a*, 106*b*, - - - , 106*e* increase toward the central portion in the widthwise direction of the oversized waveguide 103, and decrease toward the peripheral portions.

In the microwave distributor of FIG. 10, microwave signals introduced via the standard waveguide 101 are dispersed in the direction of vector E by the E-plane horn 102 and received by the waveguide-MIC converters 105*a*, 105*b*, - - - , 105*e* via oversized waveguide 103. Microwave signals received by the waveguide-MIC converters 105*a*, 105*b*, - - - , 105*e* are transmitted via MIC transmission paths 106*a*, 106*b*, - - - , 106*e* to amplifiers 107*a*, 107*b*, - - - , 107*e* and amplified. In this case, the input microwave signals are distributed into a plurality of waveguide-MIC converters 105*a*, 105*b*, - - - , 105*d* by the E-plane horn 102 and the oversized waveguide 103. Here, however, distance from a throat portion of the E-plane horn 102 to the waveguide-MIC converters 105*a*, 105*b*, - - - , 105*e* via oversized waveguide 103 vary depending upon the positions in the widthwise direction of the E-plane horn 102, i.e., depending upon the positions in the widthwise direction of the oversized waveguide 103. Accordingly, microwave electric power received by each of the waveguide-MIC converters has a different phase. However, since the MIC transmission paths 106*a*, 106*b*, - - - , 106*e* have different lengths depending upon the positions in the widthwise direction of the oversized waveguide 103, different phases are uniformalized, and microwave electric power having the same phase is input to the amplifiers 107*a*, 107*b*, - - - , 107*e*.

Figure 11:
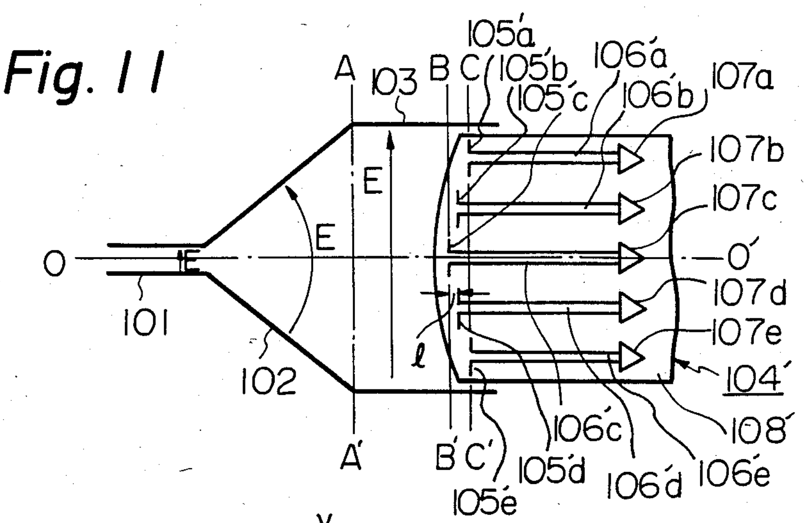

FIG. 11 shows a device for distributing microwave electric power according to another embodiment of the present invention, which is different from the embodiment of FIG. 10 with respect to construction of an MIC device 104' that is coupled to the oversized waveguide 103. The MIC device 104' comprises waveguide-MIC converters 105*a'*, 105*b'*, - - - , 105*e'* formed on a dielectric substrate 108', MIC transmission paths 106*a'*, 106*b'*, - - - , 106*e'*, and microwave amplifiers 107*a*, 107*b*, - - - , 107*d*. Here, however, depending upon the positions in the widthwise direction of the oversized waveguide 103, the waveguide-MIC converters 105*a'*, 105*b'*, - - - , 105*e'* are arrayed at different positions in the lengthwise direction of the oversized waveguide 103. Unlike the case of FIG. 10, furthermore, MIC transmission paths 106*a'*, 106*b'*, - - - , 106*e'* are formed straight to connect the waveguide-MIC converters 105*a'*, 105*b'*, - - - , 105*e'* to the amplifiers 107*a*, 107*b*, - - - , 107*e*. Due to this construction, the lengths of the MIC transmission paths 106*a'*, 106*b'*, - - - , 106*e'* can be increased toward the center portion in the widthwise direction of the oversized waveguide and decreased toward the peripheral portions, in order to uniformalize the phase distribution of microwave electric powers input to the amplifiers 107*a*, 107*b*, - - - , 107*e*. In this case, differences in the signal transmission distances from the throat portion of the E-plane horn 102 to the waveguide-MIC converters via the oversized waveguide between the central portion and peripheral portions of the waveguide become larger than those of the distributor of FIG. 10. However, since microwave signals propagate in the space in the oversized waveguide 103 at a speed faster than when they propagate on the dielectric substrate 108', it is possible to adjust the lengths of the MIC transmission paths 106*a'*, 106*b'*, - - - , 106*e'*, so that the phase distribution can be perfectly uniformalized.

Figure 12:
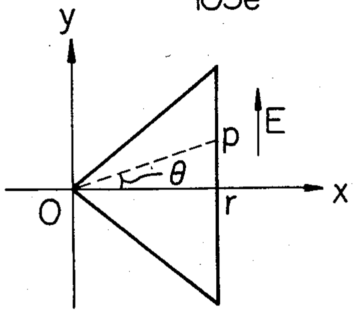
FIG. 12 is a graph of the phase distribution characteristics of the devices of FIGS. 10 and 11.

Below the phase distribution characteristics of the E-plane horn are described. As illustrated in FIG. 12, the central axis of the E-plane horn is set on the x-axis so that the y-axis passes through the throat portion of the E-plane horn. In this case, the phase distribution on an opening plane of the E-plane horn, i.e., the phase distribution at a given point P on a line which passes through a point (r, o) in FIG. 12 which is perpendicular to the x-axis, is given by the following equation:

$$\phi = \frac{2\pi r}{\lambda g}\left(\frac{1}{\cos\theta} - 1\right) \text{ (rad)} \tag{1}$$

In the above equation, $\phi$ represents a phase distribution at a given point P when the phase at the point (r, o) is O rad., $\lambda g$ represents a guide wavelength in the E-plane horn, $\theta$ represents an angle between the x-axis and the line segment connecting the point P to the origin O.

Below the case in which the phase difference generated by the E-plane horn is corrected by changing the lengths of strip lines as shown in FIG. 10 or 11 is discussed. In the device for distributing microwave electric power of, for example, FIG. 11, if the plane which includes a connection portion between the E-plane horn and the oversized waveguide is denoted by AA', the plane which is closest to the E-plane horn 102 which includes the waveguide-MIC converters is denoted by BB', and the plane which is remotest from the E-plane horn 102 which includes the waveguide-MIC converters is denoted by CC', the phase difference on the plane AA' is found from the equation (1). In the portion between the plane AA' and the plane BB', the phase difference generated by the E-plane horn is almost maintained provided the distance is short between the plane AA' and the plane BB'. Therefore, it is the portion between the plane BB' and the plane CC' which contributes to the correction of the phase. Here, the wavelength $\lambda g_2$ of a strip line is given by the following equation:

$$\lambda g_2 = \frac{\lambda}{\sqrt{\epsilon_{eff}}} \tag{2}$$

where $\lambda$ denotes a free-space wavelength, and $\epsilon_{eff}$ denotes an effective dielectric constant of a dielectric material on which strip lines are formed.

Further, if a guide wavelength of the waveguide is denoted by $\lambda g$, and the length of the waveguide by L, the quantity of phase shift $\phi_1$ is given by:

$$\phi_1 = \frac{2\pi L}{\lambda g} \tag{3}$$

In FIG. 11, therefore, if the distance between the waveguide-MIC converters and the plane BB' is denoted by l, the phase distribution $\phi_2$ on the plane CC' is given by:

$$\phi_2 = \frac{2\pi l}{\lambda g} - \frac{2\pi l}{\lambda g_2} = 2\pi l\left(\frac{1}{\lambda g} - \frac{\sqrt{\epsilon_{eff}}}{\lambda}\right) \tag{4}$$

with the quantity of the phase shift at an intersecting point of the central axis OO' and the plane CC' as a reference. Here, the sum of $\phi_2$ of the equation (4) and $\phi$ of the equation (1) should be brought to zero. Therefore, the phase distribution can be uniformalized by finding distances l which satisfy the equation:

$$\frac{r}{\lambda g}\left(\frac{1}{\cos\theta}-1\right)+l\left(\frac{1}{\lambda g}-\frac{\sqrt{\epsilon_{eff}}}{\lambda}\right)=0 \quad (5)$$

with regard to various angles $\theta$. Similarly, lengths of strip lines from the waveguide-MIC converters to the amplifiers can also be found in the device for distributing microwave electric power of FIG. 10.

Although the above description has dealt with the device for distributing microwave electric power, it will be obvious that the phase distribution is uniformalized even for a device for combining microwave electric power by using the same construction. That is, in the device for combining microwave electric power having the same construction as that of FIG. 10 or 11, microwave signals of a plurality of channels are introduced from the side of strip lines, combined through the oversized waveguide 103 and the E-plane horn 102, and the combined signals are sent into the standard waveguide 101. In this case, the microwave signals can be combined maintaining a uniform phase by changing the lengths of the strip lines depending upon the positions in the widthwise direction of the oversized waveguide.

In the embodiments mentioned above, the phase distribution can be uniformalized in a device for distributing and combining microwave electric power relying upon a very simple construction. Moreover, since hybrid circuits are not employed, a device for distributing and combining microwave electric power can be realized featuring greatly reduced transmission losses.

Figure 13:
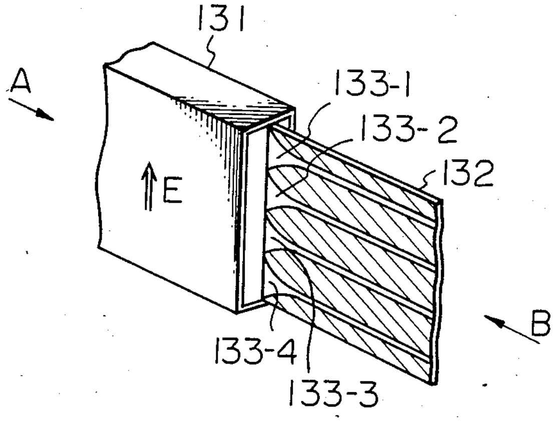
FIGS. 13 through 16 are perspective views of waveguide-MIC converters used in distributors or combiners according to the present invention.

FIG. 13 illustrates the construction of a waveguide-MIC converter used in a device for distributing and combining microwave electric power according to the present invention. In an oversized rectangular waveguide 131, the distance of a set of opposing walls is made greater than a distance between the walls of a standard waveguide. In this embodiment, the distance between the walls is increased in the direction of electric field vector indicated by arrow E, i.e., increased in the direction of the vector E. On a dielectric substrate 132 a plurality of, or four in the case of FIG. 13, MIC antennas 133-1, 133-2, 133-3, and 133-4 are formed. Each of the MIC antennas 133-1, 133-2, - - - is a so-called slot antenna obtained by forming electrically conductive patterns on the dielectric substrate 132 as indicated by the hatched areas. Further, the MIC antennas 133-1, 133-2, - - - are arrayed in the direction of electric field vector E of the oversized waveguide 131 and coupled to the transmission path of the oversized waveguide 131 at an end portion thereof.

In the waveguide-MIC converter of FIG. 13, microwave signals introduced from the side toward the oversized waveguide 131, i.e., introduced in the direction of arrow A, are received by the array of MIC antennas 133-1, 133-2, - - - at the end of oversized waveguide 131 and transmitted to a plurality of MIC channels. In this case, a standard waveguide is coupled to the input side of the oversized waveguide 131 via, for example, a horn element. Microwave power amplifiers comprising gallium-arsenic FET's are connected to the plurality of MIC antennas 133-1, 133-2, - - - . When the microwave electric power is combined by the waveguide-MIC converter of FIG. 13, microwave signals are input to the MIC antennas from the direction of arrow B. The microwave signals are emitted from the MIC antennas into the transmission path in the oversized waveguide 131 and combined into microwave electric power.

In the waveguide-MIC converter of FIG. 13, if microwave signal input from the side of arrow A is transmitted in a TE 10 mode through the oversized waveguide 131, the electric field is established by the microwave signal in a direction indicated by arrow E in FIG. 13, whereby potential differences develop among the conductors constituting the slot antennas 133-1, 133-2, - - - , and microwave electric power is transmitted. In this case, the magnetic field in the oversized waveguide 131 is established in a direction perpendicular to the arrow E, i.e., established in a direction perpendicular to slot planes of the MIC antennas or perpendicular to the plane of the dielectric substrate 132.

Figure 14:
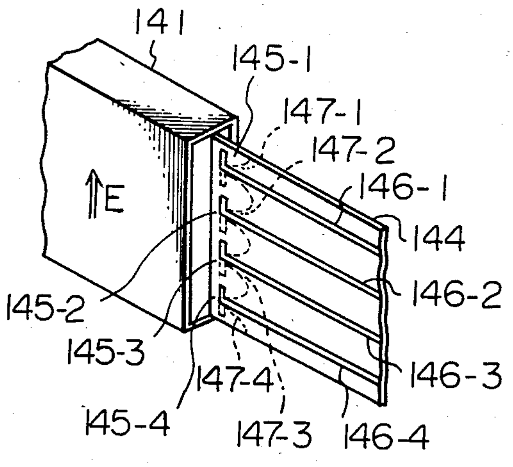

FIG. 14 shows the construction of another waveguide-MIC converter. In the waveguide-MIC converter of FIG. 14, dipole antennas 145-1, 145-2, 145-3, and 145-4 are formed on a dielectric substrate 144 in place of the slot antennas 133-1, 133-2, - - - employed in the converter of FIG. 13. The dipole antennas 145-1, 145-2, - - - comprise conductive patterns fromed on the front surface of the dielectric substrate 144 as indicated by solid lines and conductive patterns formed on the back surface as indicated by dotted lines. Conductors 146-1, 146-2, 146-3, and 146-4 forming MIC transmission paths are coupled to the dipole antenna elements formed on the front surface of the dielectric substrate 144. To the dipole antenna elements formed on the back surface of the dielectric substrate 144 are coupled to blanced to unbalanced transformer portions 147-1, 147-2, 147-3, and 147-4 which have graduaally increasing pattern widths. Patterns formed on the back surface of the dielectric substrate 144 stretching over the whole width are coupled to the subsequent stage of the balanced-to-unbalanced transformer portions.

Even in the waveguide-MIC converter of FIG. 14, a microwave signal input from the side of the oversized waveguide 141 is received separately by the dipole antennas 145-1, 145-2, - - - formed on the MIC substrate and taken out via transmission paths 146-1, 146-2, - - - in a similar manner to the case of FIG. 13. Further, the microwave signals input from the side of transmission paths 146-1, 146-2, - - - on the side of MIC substrate, are emitted from dipole antennas 145-1, 145-2, - - - into the transmission path in the oversized waveguide 141 and transmitted combined together. Even in this case, the oversized waveguide 141 is connected to the standard waveguide via, e.g., an E-plane horn. In the embodiment of FIG. 14, also, a microwave signal is transmitted in the TE 10 mode through the oversized waveguide 141 in a similar manner to the embodiment of FIG. 13. As indicated by arrow E in FIG. 14, therefore, the electric field vector is generated in a direction perpendicular to the direction in which the signal travels through the oversized waveguide 141.

Figure 15:
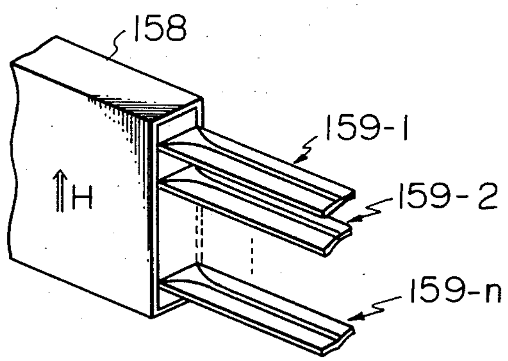

FIG. 15 illustrates a still another waveguide-MIC converter. In the waveguide-MIC converter of FIG. 15, the oversized waveguide 158 has a larger width in the direction of the magnetic field vector as indicated by arrow H. Further, MIC antennas 159-1, 159-2, - - - , 159-n coupled to the oversized waveguide 158, are arrayed so that their substrate surfaces are perpendicular to the magnetic field vector H. Therefore, the microwave signal in the oversized waveguide 158 assumes the form of, for example, TE waves of such as the TE 10 mode. In the waveguide-MIC converter of FIG. 15, therefore, TE waves in the oversized waveguide 158 are separately transmitted to the MIC antennas 159-1, 159-2, - - - , 159-n, or microwave signals from the MIC antennas 159-1, 159-2, - - - , 159-n are emitted into the oversized waveguide 158 and combined and transmitted in the form of TE waves.

Figure 16:
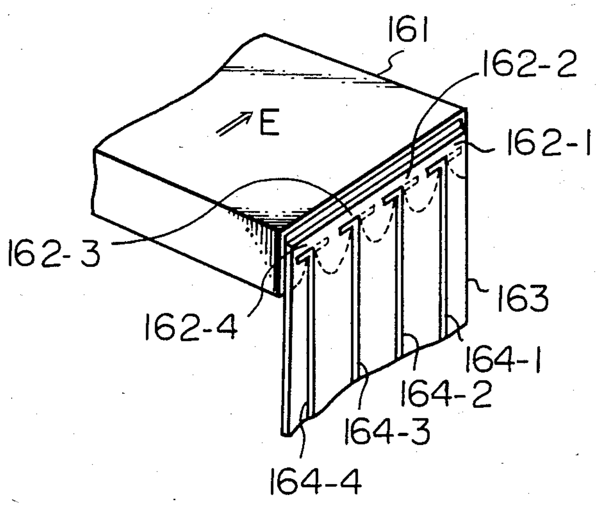

FIG. 16 shows a still another waveguide-MIC converter. In the waveguide-MIC converter of FIG. 16, an MIC substrate 163 having a plurality of dipole antenna elements 162-1, 162-2, 162-3, 162-4 is coupled to an end of the oversized waveguide 161 which is the same as that of FIG. 13 or 14. Here, however, the MIC substrate 163 is disposed at right angles to the direction in which the electromagnetic waves travel through the oversized waveguide 161, unlike the device of FIG. 13 or 14. The dipole antenna elements 162-1, 162-2, 162-3, 162-4, however, are arrayed in the oversized waveguide 161 in a direction of electric field vector E of the microwaves. In the construction of FIG. 16, the microwaves in the oversized waveguide 161 are transmitted, for example, in the TE 10 mode, received by the dipole antenna elements 162-1, 162-2, - - - , and distributed into MIC transmission paths 164-1, 164-2, 164-3, and 164-4. Conversely, microwave signals input from the MIC transmission paths 164-1, 164-2, 164-3, and 164-4 are emitted into the oversized waveguide 161 through the MIC antennas, i.e., through the dipole antennas 162-1, 162-2, 162-3, and 162-4 and combined into one signal. According to the construction of FIG. 16, the oversized waveguide 161 and the MIC transmission paths 164-1, 164-2, 164-3, and 164-4, can be set at right angles of each other or at any desired angle, thereby increasing the degree of freedom for arraying the transmission paths.

In the above-mentioned waveguide-MIC converters, the mode of electromagnetic field can be converted between the waveguide and the MIC transmission paths relying upon a very simply constructed device, thereby enabling a distribution and combination of microwave electric power. In the above-mentioned converters, furthermore, microwave electric power can be distributed and combined without using hybrid circuits. In distributing and combining microwave electric power, therefore, transmission losses can be strikingly reduced.

Figure 17:
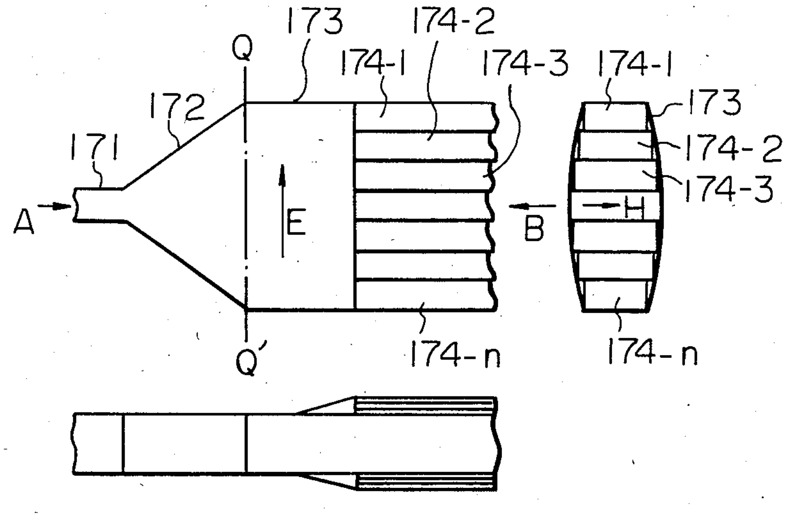
FIGS. 17 through 20 are diagrams of distributors or combiners as still other embodiments of the present invention.

FIG. 17 illustrates a construction of a device for distributing and combining microwave electric power as still another embodiment of the present invention. The device of FIG. 17 comprises an E-plane horn 172 coupled to a standard waveguide 171, an oversized waveguide 173 coupled to the E-plane horn 172, and a plurality of waveguides 174-1, 174-2, 174-3, - - - , 174-n which are coupled to the transmission path of the oversized waveguide 173. The E-plane horn 172 has a width which gradually increases in the direction of electric field vector indicated by arrow E, and the oversized waveguide 173 has a width which is enlarged in the direction of the electric field vector E and coupled to the opening portion of the E-plane horn 172. The width of the oversized waveguide 173 in the direction of magnetic field vector H changes toward the end portion where it is coupled to the waveguides 174-1, 174-2, 174-3, - - - , 174-n, depending upon the positions in the direction of electric field vector E. That is, the oversized waveguide 173 has the greatest width in the direction of magnetic field vector at the central portion of the oversized waveguide 173, and becomes gradually narrow toward both ends thereof. To meet the above-mentioned shape of the oversized waveguide 173, widths of the waveguides 174-1, 174-2, 174-3, - - - , 174-n are greatest in the direction of magnetic field vector near the central portion of the oversized waveguide 173, and become gradually smaller toward both ends of the oversized waveguide 173.

In the device of FIG. 17, microwave signals of, for example, the TE 10 mode which are input from the side of the standard waveguide 171, i.e., from the side of arrow A, are dispersed in the direction of electric field vector E by the E-plane horn 172 and distributed to the waveguides 174-1, 174-2, 174-3, - - - , 174-n through the oversized waveguide 173. In this case, therefore, the device of FIG. 17 works to distribute microwave electric power. Conversely, microwave signals input from the side of waveguides 174-1, 174-2, 174-3, - - - , 174-n, i.e., input from the side of arrow B, are combined by the oversized waveguide 173 and the E-plane horn 172 and transmitted into the standard waveguide 171. In this case, therefore, the device of FIG. 17 works to combine microwave electric power.

When the device of FIG. 17 is used for distributing microwave electric power, the microwave signals input from the side of standard waveguide 171 are distributed to the waveguides 174-1, 174-2, 174-3, - - - , 174-n via the E-plane horn 172 and the oversized waveguide 173. Here, however, the distance from the throat portion of the E-plane horn to the opening portion differs depending upon the positions of the oversized waveguide 173 in the direction of electric field vector E. Therefore, phases of the microwave signals become nonuniform on the opening plane Q—Q' of the E-plane horn 172. The phase can be corrected and uniformalized by changing the width of the oversized waveguide 173 and widths of the waveguides 174-1, 174-2, 174-3, - - - , 174-n in the direction of magnetic field vector H, depending upon the positions in the direction of electric field vector E. That is, as will be discussed in detail later the phase delay of signal in the opening plane of the E-plane horn 172 becomes large as it moves away from the central portion toward the direction of vector E. Furthermore, in the waveguide, in general, the amount of phase rotation a decrease with the decrease in the width. Therefore, the phase can be corrected by selecting the widths of the waveguides 174-1, 174-2, 174-3, - - - , 174-n to be greatest in the central portion, and to be decreased as they separate away from the central portion along the direction of vector E.

Figure 18:
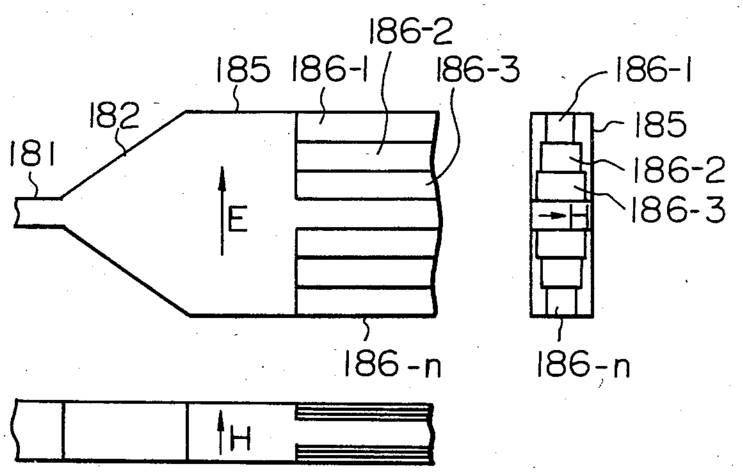

FIG. 18 shows a device for distributing and combining microwave electric power according to still another embodiment of the present invention. In the device of FIG. 18, width of the oversized waveguide 185 coupled to the E-plane horn 182 is constant in the direction of magnetic field vector H, and lateral widths of the plurality of waveguides 186-1, 186-2, 186-3, - - - , 186-n coupled to the oversized waveguide 185, change depending upon the positions of the oversized waveguide 185 in the direction of electric field vector E. In the embodiment of FIG. 18, furthermore, a maximum lateral width of the waveguides 186-1, 186-2, 186-3, - - - , 186-n is the same as the width of the oversized waveguide 185 in the direction of magnetic field vector H, and gradually decreases toward both ends in the direction of electric field vector E.

The device for distributing and combining microwave electric power shown in FIG. 18 operates in the same manner as the embodiment of FIG. 17. Namely, the phase characteristics are uniformalized by changing the widths of the waveguides 186-1, 186-2, 186-3, - - - , 186-n depending upon the positions in the direction of vector E.

Figure 19:
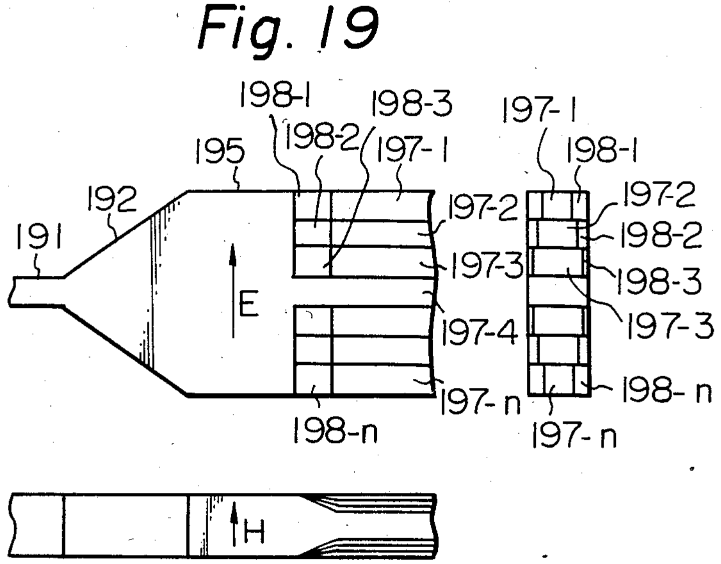

FIG. 19 shows a device for distributing and combining microwave electric power according to still another embodiment of the present invention. In this embodiment, the oversized waveguide 195 has a width which remains nearly constant in the direction of magnetic field vector H like in the embodiment of FIG. 18. Here, however, waveguides 197-1, 197-2, 197-3, - - - , 197-n having different lateral widths are coupled to an end of the oversized waveguide 195 via H-plane horns 198-1, 198-2, 198-3, - - - , 198-n, respectively. In this case, the waveguide 197-4 coupled to the central portion of the oversized waveguide 195 in the direction of vector E has the same width as that of the oversized waveguide 195 in the direction of magnetic field vector H and, hence, is directly coupled to the oversized waveguide 195 without using H-plane horn. Widths of waveguides successively arrayed on both sides of the waveguide 197-4 become gradually narrower than the width of the waveguide 197-4, and H-plane horns have such widths that these waveguides are coupled to the oversized waveguide 195 without developing steps.

The device for distributing and combining microwave electric power of FIG. 19 operates in the same mannr as the devices of FIGS. 17 and 18. Phase characteristics produced by the E-plane horn 192 can be corrected by suitably setting the widths of the waveguides 197-1, 197-2, 197-3, - - - , 197-n, thereby uniformalizing the phase distribution of the distributed signals on the plane separated away from the end surface of the oversized waveguide 195 by predetermined distances. In the device of FIG. 19, unlike the device of FIG. 18, the waveguides 197-1, 197-2, 197-3, - - - , 197-n are coupled to the oversized waveguide 195 through H-plane horns 198-1, 198-3, - - - , 198-n, without developing steps. Therefore, the electromagnetic waves are not reflected at the coupling portions, and transmission losses are reduced.

Figure 20:
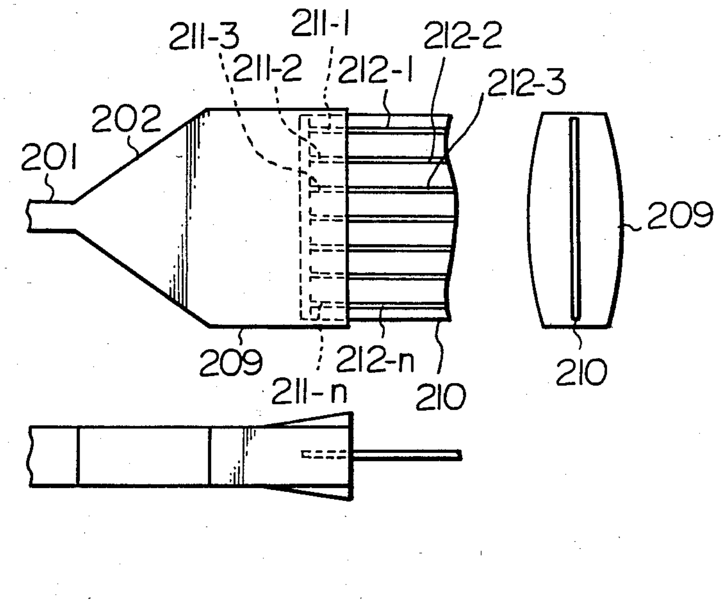

FIG. 20 illustrates a device for distributing and combining microwave electric power according to still another embodiment of the present invention. In the embodiment of FIG. 20, the oversized waveguide 209 is not coupled to a plurality of waveguides unlike the aforementioned devices, but is coupled to a plurality of dipole antenna elements 211-1, 211-2, 211-3, - - - , 211-n that are formed on an MIC substrate 210. The individual MIC dipole antenna elements 211-1, 211-2, 211-3, - - - , 211-n are coupled to MIC elements such as microwave amplifiers that are not shown via strip lines 212-1, 212-2, 212-3, - - - , 212-n formed on the MIC substrate 210. Further, the lateral width of the oversized waveguide 209, i.e., the width in the direction of magnetic field vector H, changes in the portion where it is coupled to the MIC dipole antenna elements depending upon the positions in the direction of electric field vector E. Namely, the lateral width is the greatest at the central portion and gradually decreases toward both ends in the direction of electric field vector E. This shape makes it possible to correct the phase characteristics produced by the E-plane horn 202.

In the device for distributing and combining microwave electric power of FIG. 20, the microwave electric power input through the standard waveguide 201, propagates through the E-plane horn 202 and oversized waveguide 209, received by the MIC dipole antenna elements 211-1, 211-2, 211-3, - - - , 211-n, and is transmitted through the strip lines 212-1, 212-2, 212-3, - - - , 212-n. On the other hand, the microwave signals input through the strip lines 212-1, 212-2, 212-3, - - - , 212-n are emitted from the MIC dipole antenna elements 211-1, 211-2, 211-3, - - - , 211-n into the transmission path in the oversized waveguide 209, combined by the E-plane horn 202, and taken out through the standrd waveguide 201. In the embodiment of FIG. 20, the phase distribution characteristics produced by the E-plane horn 202 can be corrected by changing the width of oversized waveguide 209 in the direction of magnetic field vector H depending upon the positions in the direction of electric field vector E. Namely, the phase distribution characteristics can be uniformalized at the moment when the microwave signals are received by the MIC dipole antenna elements 211-1, 211-2, 211-3, - - - , 211-n. According to this embodiment, furthermore, the device can be simply constructed since it does not use a plurality of waveguides that are employed in the preceding embodiments.

Figure 21:
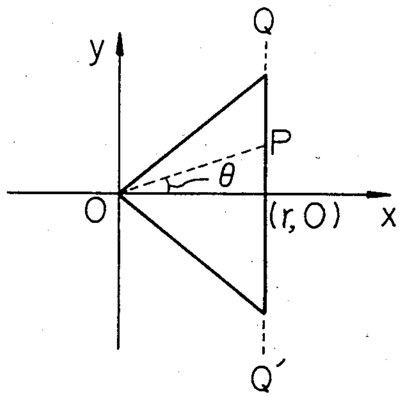
FIG. 21 is a graph illustrating the phase distribution characteristics of the devices of FIGS. 17 through 20.

Phase distribution characteristics of the E-plane horn are explained below. As shown in FIG. 21, central axis of the E-plane horn is set on the X-axis so that the y-axis passes through the throat portion of the E-plane horn. In this case, the phase distribution on an opening plane of the E-plane horn, i.e., the phase distribution at a given point P on a line Q—Q′ which passes through a point (r, o) in FIG. 21 which is perpendicular to the x-axis, is given by the following equation:

$$\phi = \frac{2\pi r}{\lambda g}\left(\frac{1}{\cos\theta} - 1\right) \tag{6}$$

where $\phi$ represents a phase distribution at a given point P when the phase at the point (r, o) is O rad., $\lambda g$ represents a guide wavelength in the E-plane horn, and $\theta$ represents an angle between the x-axis and the line segment connecting the point P to the origin O.

Figure 22:
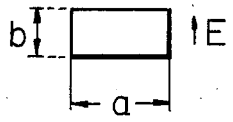
FIGS. 22 and 23 are diagrams of the phase characteristics of the devices of FIGS. 17 through 20.

Below the phase characteristics, with regard to lateral width of the waveguide are described. FIG. 22 shows in cross section and waveguide, in which a guide wavelength $\lambda g_1$ and a cut-off wavelength $\lambda c$ are determined by the lateral width a of the waveguide. Namely, if a free-space wavelength is denoted by $\lambda$, the cut-off wavelength $\lambda c$ and the guide wavelength $\lambda g_1$ are given by:

$$\lambda c = 2a \tag{7}$$

$$\lambda g_1 = \frac{\lambda}{\sqrt{1 - \left(\frac{\lambda}{\lambda c}\right)^2}} \tag{8}$$

Therefore, if the length of the waveguide is denoted by l, the phase shift $\phi_1$ is given by:

$$\phi_1 = \frac{2\pi l}{\lambda g_1} \tag{9}$$

In a standard waveguide, a=2b in the cross section of FIG. 22.

From the equations (7) to (9), when the lateral width of the waveguide is narrower than that of the standard waveguide, the guide wavelength $\lambda g_1$ lengthens; i.e., the amount of phase rotation decreases. When the lateral width of the waveguide is broader than that of the standard waveguide, the guide wavelength $\lambda g_1$ shortens; i.e., the amount of phase rotation increases.

As apparent from the above-mentioned explanation, in order to correct the phase difference generated by the E-plane horn by changing lateral widths of the waveguides in the aforementioned embodiments, waveguides having broad widths should be used in the central portion of the E-plane horn to obtain large phase rotation, and widths should be gradually narrowed from the central portion toward both ends in order to reduce the phase rotation. In the embodiments of FIG. 18 or 19, therefore, lateral widths of the waveguides 186-1, 186-2, 186-3, - - - , 186-n or 197-1, 197-2, 197-3, - - - , 197-n coupled to the oversized waveguide 185 or 195, should be broadened in the central portion of the oversized waveguide and narrowed toward both ends along the direction of vector E.

Figure 23:
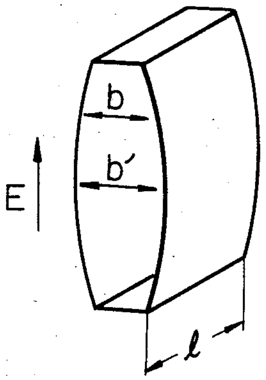

In the embodiment of FIG. 17 or 20, the lateral width of the oversized waveguides 173 and 209 is broadened in the central portion and narrowed toward both ends thereof. The oversized waveguides 173 and 209 have lateral widths which are constant in the portions where they are coupled to the E-plane horn 172 or 202, and lateral widths that change depending upon the positions in the direction of electric field vector E in the portions where they are coupled to the waveguides 174-1, 174-2, 174-3, - - - , 174-n and to the MIC dipole antenna elements 211-1, 211-2, 211-3, - - - , 211-n. For easy comprehension, lateral widths are found below at each of the positions in the case when the oversized waveguide has lateral widths that are uniformly distributed in the lengthwise direction thereof, as shown in FIG. 23. From the equation (8), if the length of the waveguide is denoted by l, lateral width at the center by b', and the phase quantity at the central position by $\phi'$, the phase distribution $\phi_1$ of the oversized waveguide in the direction of electric field vector E is given by:

$$\phi_1 = \frac{2\pi l}{\lambda}\left[\sqrt{1-\left(\frac{\lambda}{2b}\right)^2} - \sqrt{1-\left(\frac{\lambda}{2b'}\right)^2}\right] \tag{10}$$

with the phase quantity at the center as a reference.

To correct the phase difference produced by the E-plane horn, the sum of phase quantity $\phi$ found by the equation (6) and phase quantity $\phi_1$ found by the equation (10) should be brought to zero. For this purpose, the following equation holds true:

$$\frac{r}{\lambda g}\left(\frac{1}{\cos\theta} - 1\right) + \frac{l}{\lambda}\left[\sqrt{1-\left(\frac{\lambda}{2b}\right)^2} - \sqrt{1-\left(\frac{\lambda}{2b'}\right)^2}\right] = 0 \tag{11}$$

Therefore, characteristics of lateral width distribution of the oversized waveguide can be obtained by finding the values b relative to various angles $\theta$ relying upon the equation (11).

According to the above-mentioned embodiments, phase characteristics of microwaves in the waveguides can be uniformalized at predetermined distances from the opening plane of the oversized waveguide. Therefore, phase characteristics of the distributed microwave signals can be uniformalized by providing waveguide-MIC converters or microwave amplifiers at the above-mentioned positions. In the case of the device for combining microwave electric power, the microwave signals can be efficiently combined while maintaining the same phase by supplying microwave signals of the same phase from the above-mentioned positions.

Also in the embodiments mentioned above, the phase distribution can be uniformalized in combining or distributing microwave signals by relying upon a very simply constructed device. Moreover, since hybrid circuits are not employed, transmission losses can be greatly reduced at the time of distributing or combining microwave electric power.

Figure 24:
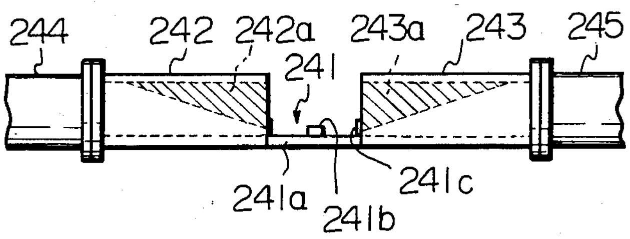
Fig. 24 PRIOR ART
FIG. 24 is a schematic view of a conventional microwave power amplifier.

FIG. 24 illustrates a conventional power amplifier in which an amplifier 241 of a microwave integrated circuit (MIC) is inserted in waveguides 244 and 245 of the transmission path via mode-converting ridge waveguides 242 and 243 interposed on the input and output sides of the amplifier 241. With this system, however, increased spaced is required for inserting the waveguides 242 and 243, mode conversion losses are increased, and connection between the amplifier 241 and waveguides 242 and 243 is not reliable since the conductor pieces 241*c* of the input and output terminals of the amplifier are simply brought into contact with ridges 242*a* and 243*a* of the waveguides 242 and 243. In FIG. 24, reference numeral 241*b* denotes an amplifier element such as an FET.

Figure 25:
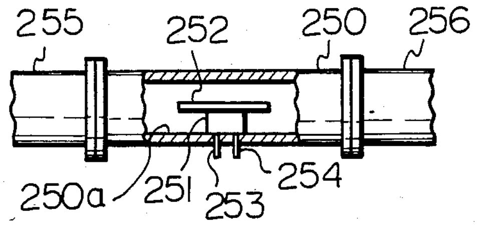
FIG. 25 is a schematic partially cut away view of a microwave power amplifier used in a distributor or a combiner according to the present invention.

FIG. 25 illustrates a power amplifier which can be adaptable to the device for distributing and combining microwave electric power according to the present invention. In FIG. 25, reference numeral 250 denotes a short waveguide that is inserted between waveguides 255 and 256 which comprise a signal transmission path, 251 denotes a metal block secured to the bottom surface 250*a* of the waveguide 250, 252 denotes a high-frequency power amplifier of the MIC construction secured onto the metal block 251, and 253 and 254 denote terminals for biasing the amplifier element.

Figure 26:
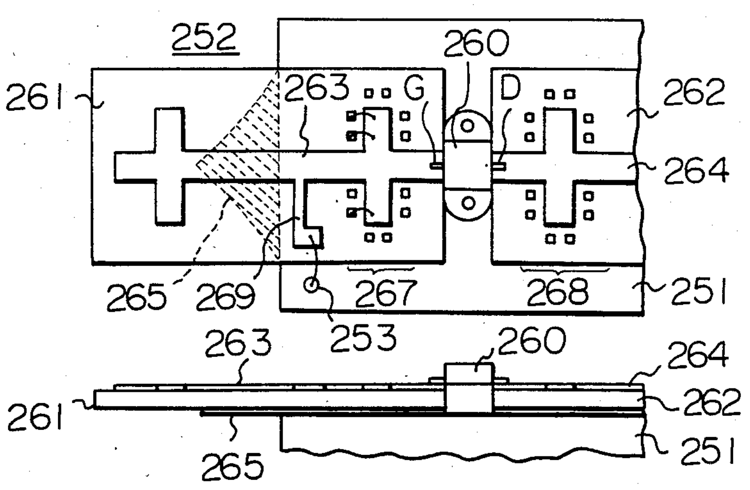
FIG. 26 provides partial views of the microwave power amplifier of FIG. 25 in detail.

FIG. 26 illustrates in detail the amplifier 252, in which reference numeral 260 denotes an amplifier element such as a packaged-type FET, 261 and 262 denote dielectric substrates divided into two (the amplifier element 260 may be mounted on the center of a piece of substrates), 263 and 264 denote surface patterns, i.e., conductors, and 265 denote a back-surface pattern which stretches to the side of the conductor 264.

Figure 28:
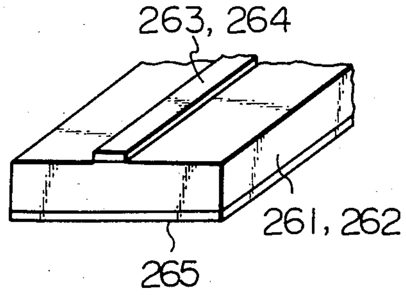
FIG. 28 is a perspective view of a structure of a microstrip line.
Figure 29:
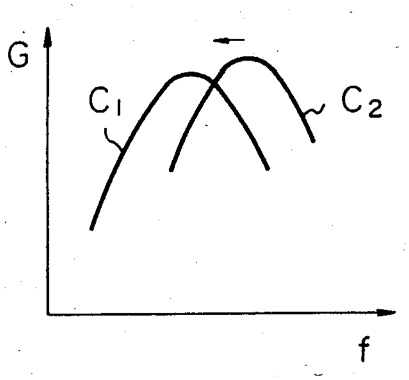
FIG. 29 is a graph of the frequency-gain characteristics of a circuit of FIG. 27.

Base portions of the surface patterns 263 and 264, i.e., the sides of the amplifier element 260, comprise a microstrip line together with the back-surface pattern 265 as shown in FIG. 28, whereby ends thereof serve as the transmitting antenna and a receiving antenna, respectively. Gate electrode G and drain electrode D of the FET 260 are soldered or wire-bonded to the base portions of the surface patterns 263 and 264. Matching adjusting elements 267 and 268 are provided in the base portions of the surface patterns 263 and 264 to properly match the impedance with regard to the FET 260. That is, the amplifier element have different S-parameters even when they have the same ratings, and the frequency f vs. gain G characteristics are often deviate from a predetermined curve $C_1$ as shown by $C_2$ in FIG. 29. To correct the deviation, a plurality of thin conductive films represented by small squares in FIG. 26 are suitably wire-bonded onto the surface patterns 263 and 264 to adjust the electrostatic capacitance with respect to the back-surface pattern.

Figure 27:
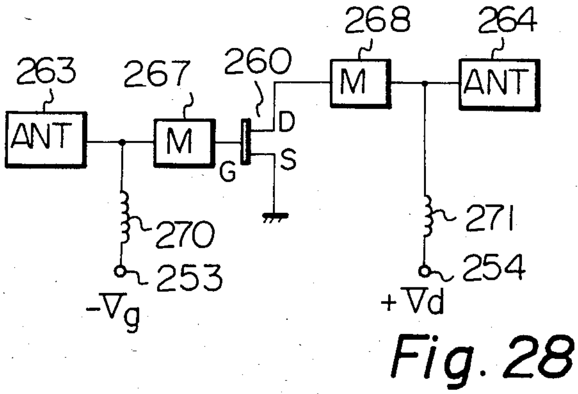
FIG. 27 is a block circuit diagram of an equivalent circuit of the device of FIG. 26.

FIG. 27 is a diagram of an equivalent circuit, in which $-$Vg denotes a negative bias voltage applied to the gate electrode G, and +Vd denotes a positive bias voltage applied to the drain electrode D. The source electrode S is grounded via the metal block 251. Choke coils 270 and 271 are established by branched patterns 269 of the surface patterns 263 and 264.

The tapered end of the back-surface pattern 265 works to adjust the impedance so that the surface pattern 263 will effectively serve as an antenna. In the ordinary MIC construction, the back surface has a uniform earth pattern. According to the present invention, however, the end of the pattern 265 is narrowed to adjust the capacity relative to the surface pattern 263, i.e., the width of the pattern gradually increases from the end to realize an optimum matching condition with the least amount of reflection.

The above-mentioned high-frequency power amplifier presents the following advantages:

(1) Reduced space is required since two ridge waveguides are not needed to convert the mode.

(2) The amplifier element features improved input and output efficiency due to the use of a microstrip matching circuit which is based on a tapered back-surface pattern and surface patterns.

(3) Since the amplifier is coupled to the transmission path through antennas, high reliability is maintained in the connection portions.

(4) When the amplifiers are to be connected in a plurality of stages, a plurality of waveguides 250 containing amplifiers should be connected in cascade. In this case, the amplifiers are connected through antennas which have a function to cut off direct current. Therefore, there is no need to use capacitors for cutting off the direct current, i.e., for cutting off the bias voltage, unlike the case of connecting the transistors in a plurality of stages.

We claim:

1. A device for distributing and combining microwave electric power, comprising:

- a first microwave path;
- a plurality of second microwave paths each including an MIC transmission line, a waveguide/MIC converting element coupled to said MIC transmission line, and a planar dielectric substrate on which at least a portion of said second microwave paths being formed;
- an electromagnetic horn having a rectangular cross-section, a throat portion coupled to said first microwave path and an opening portion for transmitting a microwave signal;
- an oversized rectangular waveguide coupled to the opening portion of said horn at one end, the other end of said oversized waveguide being coupled to said plurality of second microwave paths; and
- phase compensating means for uniformalizing the phase and the magnitude of the microwave signal distributed by said horn or for adjusting the phases of microwave signals output from said plurality of second microwave paths therein, said phase compensating means being located at a coupling portion from said horn to said oversized waveguide, said phase compensating means comprising a dielectric lens comprising a dielectric substance.

2. A device according to claim 1, wherein said dielectric lens is disposed at the coupling portion of said horn and said oversized waveguide.

3. A device for distributing and combining microwave electric power, comprising:

- a first microwave path;
- a plurality of second microwave paths each including an MIC transmission line, a waveguide/MIC converting element coupled to said MIC transmission line, and a planar dielectric substrate on which at least a portion of said second microwave paths being formed;
- an electromagnetic horn having a rectangular cross-section, a throat portion coupled to said first microwave path and an opening portion for transmitting a microwave signal;
- an oversized rectangular waveguide coupled to the opening portion of said horn at one end, the other end of said oversized waveguide being coupled to said plurality of second microwave paths; and
- phase compensating means for uniformalizing the phase and the magnitude of the microwave signal distributed by said horn or for adjusting the phases of microwave signals output from said plurality of second microwave paths therein, said phase compensating means being located at a coupling portion from said horn to said oversized waveguide, said phase compensating means comprising one or more reflectors.

4. A device according to claim 3, wherein said reflectors are disposed at the coupling portion between said horn and said oversized waveguide.

5. A device according to claim 4, wherein said phase compensating means comprises two reflectors.

6. A device according to claim 1 or 3, wherein said oversized waveguide has a direction of enlargement, and wherein each of said plurality of second microwave paths is disposed at the end portion of or within said oversized waveguide, the length of each said MIC transmission line varying in accordance with the position of the corresponding waveguide/MIC converting element along the direction of enlargement of said oversized waveguide.

7. A device according to claim 6, wherein the length of said MIC transmission line corresponding to said waveguide/MIC converting element disposed at the central position along the direction of enlargement of said oversized waveguide is the largest, and said length becomes smaller as the distance from the central position increases.

8. A device according to claim 6, wherein the positions of said waveguide/MIC converting elements along the propagation path of the microwave signal vary in accordance with the position thereof along the direction of enlargement of said oversized waveguide.

9. A device according to claim 1 or 3, wherein the width of said oversized waveguide varies in accordance with the position along the direction of enlargement of said horn.

10. A device according to claim 9, wherein said width of said oversized waveguide is largest at the central position along the direction of enlargement of said horn and becomes smaller in accordance with the distance from the central position.

11. A device according to claim 1 or 3, wherein said phase compensating means is formed on said dielectric substrate, and each of said microwave paths is disposed at the end portion of or within said oversized waveguide, each of said waveguide/MIC converting elements comprises a MIC dipole antenna formed on the sides of the dielectric substrate.

12. A device according to claim 1 or 3, wherein said phase compensating means is formed on said dielectric substrate, and each of said second microwave paths is disposed at an end portion of or within said oversized waveguide, each of said waveguide/MIC converting elements comprises a MIC slot antenna formed on one side of the dielectric substrate and having a slot line portion.

13. A device according to claim 12, wherein each of said waveguide/MIC converting elements further comprises a conductor line pattern formed on the opposite side from said MIC slot antenna formed on said dielectric substrate, said conductor line pattern being formed along a direction perpendicular to the direction of the slot line portion of said MIC slot antenna.

14. A device according to claim 1 or 3, wherein each of said second microwave paths comprise a microwave power amplifier comprising:

a metal block secured and disposed in said oversized waveguide;

said dielectric substrate secured on said metal block; a pair of strip conductors formed on the surface of said substrate;

at least one antenna element formed at the end of at least one of said pair of strip conductors;

an amplifier element having an input terminal and an output terminal connected to said pair of strip conductors, respectively; and a back surface pattern provided on the back surface of said substrate and which comprises a microstrip line together with the one of said strip conductors for impedance matching with said amplifier element, at least one end of said back surface pattern being a narrowed end to obtain impedance matching with said antenna.

15. A device for distributing and combining microwave electric power, comprising:

a first microwave path;

a plurality of second microwave paths each including an MIC transmission line, a waveguide/MIC converting element coupled to said MIC transmission line, and a planar dielectric substrate on which at least a portion of said second microwave paths being formed;

a horn having a rectangular cross-section, a throat portion coupled to said first microwave path and an opening portion for transmitting a microwave signal; and an oversized rectangular waveguide coupled to the opening portion of said horn at one end, the other end of said oversized waveguide being coupled to said plurality of second microwave paths and a width of said oversized waveguide varying in accordance with the position along a direction of enlargement of said horn.

16. A device according to claim 15, wherein said width of said oversized waveguide is largest at a central position along the direction of enlargement of said horn and becomes smaller in accordance with the distance from the central position.

17. A device according to claim 15 or 16, wherein each of said plurality of second microwave paths is disposed at an end portion of or within said oversized waveguide, a length of said MIC transmission line varying in accordance with the position of the corresponding waveguide/MIC converting element along the direction of enlargement of said oversized waveguide.

18. A device according to claim 17, wherein the length of said MIC transmission line corresponding to the waveguide/MIC converting element disposed at the central position along the direction of enlargement of said oversized waveguide is largest, and said length becomes smaller as the distance from the central position increases.

19. A device according to claim 17, wherein the positions of said waveguide/MIC converting elements along the propagation path of the microwave signal vary in accordance with the position thereof along the direction of enlargement of said oversized waveguide.

20. A device according to claim 15 or 16, wherein each of said second microwave paths is disposed at an end portion of or within said oversized waveguide, each of said waveguide/MIC converting elements comprises an MIC dipole antenna formed on the sides of the dielectric substrate.

21. A device according to claim 15 or 16, wherein each of said second microwave paths is disposed at an end portion of or within said oversized waveguide, each of said waveguide/MIC converting elements comprises an MIC slot antenna formed on one side of the dielectric substrate and having a slot line portion.

22. A device according to claim 21, wherein each of said waveguide/MIC converting elements further comprises a conductor line pattern formed on the opposite side from said MIC slot antenna formed on said dielectric substrate, said conductor line pattern being formed along a direction perpendicular to the direction of the slot line portion of said MIC slot antenna.

23. A device according to claim 15 or 16, wherein said second microwave paths comprise a path waveguide, and each of said second microwave paths comprises a microwave power amplifier comprising:

a metal block secured and disposed in said path waveguide;

said dielectric substrate secured on said metal block;

a pair of strip conductors formed on the surface of said substrate;

at least one antenna element formed at the end of at least one of said pair of strip conductors;

an amplifier element having an input terminal and an output terminal connected to said pair of strip conductors, respectively; and a back surface pattern provided on the back surface of said substrate which comprises a microstrip line together with the one of said strip conductors for impedance matching with said amplifier element, at least one end of said back surface pattern being a narrowed end to obtain impedance matching with said antenna.

24. A device for distributing and combining microwave electric power, comprising:

a first microwave path;

a plurality of second microwave paths each including an MIC transmission line, a waveguide/MIC converting element coupled to said MIC transmission line and a planar dielectric substrate on which at least a portion of said second microwave paths being formed;

a horn, having a rectangular cross-section, a throat portion coupled to said first microwave path and an opening portion, for transmitting a microwave signal; and an oversized rectangular waveguide coupled to the opening portion of said horn at one end, the other end of said oversized waveguide coupled to said plurality of second microwave paths, said oversized waveguide having a length, a direction of enlargement along a height of said oversized waveguide, and each of said second microwave paths being a path waveguide having a width determined in accordance with its position along the height direction of said oversized waveguide.

25. A device according to claim 24, wherein said width of each path waveguide of said second microwave paths is largest at the central position along the direction of enlargement of said oversized waveguide and becomes smaller in accordance with the distance from the central position.

26. A device according to claim 24 or 25, wherein said waveguide/MIC converting element comprises an MIC dipole antenna formed on the sides of said dielectric substrate.

27. A device according to claim 24 or 25, wherein said waveguide/MIC converting element comprises an MIC slot antenna formed on one side of said dielectric substrate and having a slot line portion.

28. A device according to claim 27, wherein each of said waveguide/MIC converting elements further comprises a conductor line pattern formed on the opposite side from said MIC slot antenna formed on said dielectric substrate, said conductor line pattern being formed along a direction perpendicular to the direction of the slot line portion of said MIC slot antenna.

29. A device according to claim 24 or 25, wherein each of said second microwave paths further comprises a microwave power amplifier comprising:

- a metal block secured and disposed in the corresponding path waveguide;
- said dielectric substrate secured on said metal block;
- a pair of strip conductors formed on the surface of said substrate;
- at least one antenna element formed at the end of at least one of said pair of strip conductors;
- an amplifier element having an input terminal and an output terminal connected to said pair of strip conductors, respectively; and
- a back surface pattern provided on the back surface of said substrate which comprises a microstrip line together with the one of said strip conductors for impedance matching with said amplifier element, at least one end of said back surface pattern being a narrowed end to obtain impedance matching with said antenna.

30. A device according to claim 6, wherein said horn has a direction of enlargement, and the width of said oversized waveguide varies in accordance with a position along the direction of enlargement of said horn.

31. A device according to claim 8, wherein said horn has a direction of enlargement, and the width of said oversized waveguide varies in accordance with a position along the direction of enlargement of said horn.

32. A device according to claim 6, wherein said phase compensating means is formed on said dielectric substrate, and each of said waveguide/MIC converting element comprising an MIC slot antenna formed on one side of said dielectric substrate, and a conductor line pattern formed on the opposite side from said MIC slot antenna formed on said dielectric substrate, and formed along a direction perpendicular to a direction of the slot line portion of said MIC slot antenna.

33. A device according to claim 8, wherein said phase compensating means is formed on said dielectric substrate, and each of said waveguide/MIC converting element comprising an MIC slot antenna formed on one side of said dielectric substrate, and a conductor line pattern formed on the opposite side from said MIC slot antenna formed on said dielectric substrate, and formed along a direction perpendicular to the direction of a slot line portion of said MIC slot antenna.

34. A device according to claim 6, wherein each of said second microwave paths further comprises a microwave power amplifier comprising:

- a metal block secured and disposed in said oversized waveguide;
- said dielectric substrate secured on said metal block;
- at least one antenna element formed at the end of at least one of said pair of strip conductors;
- an amplifier element having an input terminal and an output terminal connected to said pair of strip conductors, respectively; and
- a back surface pattern provided on the back surface of said substrate which comprises a microstrip line together with the one of said strip conductors for impedance matching with said amplifier element, at least one end of said back surface pattern being a narrowed end to obtain impedance matching with said antenna.

35. A device accoding to claim 8, wherein each of said second microwave paths further comprises a microwave power amplifier comprising:

- a metal block secured and disposed in said oversized waveguide;
- said dielectric substrate secured on said metal block;
- a pair of strip conductors formed on the surface of said substrates;
- at least one antenna element formed at the end of at least one of said pair of strip conductors;
- an amplifier element having an input terminal and an output terminal connected to said pair of strip conductors, respectively; and
- a back surface pattern provided on the back surface of said substrate which comprises a microstrip line together with the one of said strip conductors for impedance matching with said amplifier element, at least one end of said back surface pattern being a narrowed end to obtain impedance matching with said antenna.

36. A device according to claim 9, wherein each of said second microwave paths is disposed at the end portion of or within said oversized waveguide, each of said waveguide/MIC converting elements comprises an MIC slot antenna formed on one side of the dielectric substrate, and a conductor line pattern formed on the opposite side from said MIC slot antenna formed on said dielectric substrate, and formed along a direction perpendicular to the direction of a slot line portion of said MIC slot antenna.

37. A device according to claim 9, wherein each of said second microwave paths further comprises a microwave power amplifier comprising:

- a metal block secured and disposed in said oversized waveguide;
- said dielectric substrate secured on said metal block;
- a pair of strip conductors formed on the surface of said substrate;
- at least one antenna element formed at the end of at least one of said pair of strip conductors;
- an amplifier element having an input terminal and an output terminal connected to said pair of strip conductors, respectively; and
- a back surface pattern provided on the back surface of said substrate which comprises a microstrip line together with the one of said strip conductors for impedance matching with said amplifier element, at least one end of said back surface pattern being a narrowed end to obtain impedance matching with said antenna.

38. A device according to claim 13, wherein each of said second microwave paths further comprises a microwave power amplifier comprising:

a metal block secured and disposed in said oversized waveguide;

said dielectric substrate secured on said metal block;

a pair of strip conductors formed on the surface of said substrate, one of said strip conductors coupled to said conductor line pattern;

at least one antenna element formed at the end of at least one of said pair of strip conductors, said antenna element forming said MIC slot antenna;

an amplifier element having an input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern having a narrowed end to obtain impedance matching with said antenna.

39. A device according to claim 22, wherein said second microwave paths comprise a path waveguide, and wherein each of said second microwave paths further comprises a microwave power amplifier comprising:

a metal block secured and disposed in said path waveguide;

said dielectric substrate secured on said metal block;

a pair of strip conductors formed on the surface of said substrate, one of said strip conductors coupled to said conductor line pattern;

at least one antenna element formed at the end of at least one of said pair of strip conductors, said antenna element forming said MIC slot antenna;

an amplifier element having an input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern being a narrowed end to obtain impedance matching with said antenna.

40. A device according to claim 28, wherein each of said second microwave paths further comprises a microwave power amplifier comprising:

a metal block secured and disposed in said path waveguide;

said dielectric substrate secured on said metal block;

a pair of strip conductors formed on the surface of said substrate, one of said strip line conductors coupled to said conductor line pattern;

at least one antenna element formed at the end of at least one of said pair of strip conductors, said antenna element forming said MIC slot antenna;

an amplifier element having an input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern being a narrowed end to obtain impedance matching with said antenna.

41. A device according to claim 30, wherein each of said second microwave paths comprises said dielectric substrate and each of said waveguide/MIC converting elements comprises an MIC slot antenna formed on one side of said dielectric substrate, and a conductor line pattern formed on the opposite side from said MIC slot antenna formed on said dielectric substrate, and formed along the direction perpendicular to a direction of a slot line portion of said MIC slot antenna.

42. A device according to claim 31, wherein each of said second microwave paths comprise said dielectric substrate, and each of said waveguide/MIC converting elements comprises an MIC slot antenna formed on one side of said dielectric substrate, and a conductor line pattern formed on the opposite side from said MIC slot antenna formed on said dielectric substrate, and formed along a direction perpendicular to the direction of a slot line portion of said MIC slot antenna.

43. A device according to claim 32, wherein each of said second microwave paths further comprises a microwave power amplifier comprising:

a metal block secured and disposed in said oversized waveguide;

said dielectric substrate secured on said metal block;

a pair of strip conductors formed on the surface of said substrate, one of said strip line conductors coupled to said conductor line pattern;

at least one antenna element formed at the end of at least one of said pair of strip conductors, said antenna element forming said MIC slot antenna;

an amplifier element having an input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern being a narrowed end to obtain impedance matching with said antenna.

44. A device according to claim 33, wherein each of said second microwave paths further comprises a microwave power amplifier comprising:

a metal block secured and disposed in said oversized waveguide;

said dielectric substrate secured on said metal block;

a pair of strip conductors formed on the surface of said substrate, one of said strip line conductors coupled to said conductor line pattern;

at least one antenna element formed at the end of at least one of said pair of strip conductors, said antenna element forming said MIC slot antenna;

an amplifier element having an input terminal and an output terminal connected to said pair of strip conductors, respectively; and a back surface pattern provided on the back surface of said substrate which comprises a microstrip line together with the one of said strip conductors for impedance matching with said amplifier element, at least one end of said back surface pattern being a narrowed end to obtain impedance matching with said antenna.

45. A device according to claim 30, wherein each of said second microwave paths further comprises a microwave power amplifier comprising:

a metal block secured and disposed in said oversized waveguide;

said dielectric substrate secured on said metal block;

a pair of strip conductors formed on the surface of said substrate, one of said strip conductors forming part of said MIC transmission line;

at least one antenna element formed at the end of at least one of said pair of strip conductors, said antenna element forming said waveguide/MIC converting element;

an amplifier element having an input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern being a narrowed end to obtain impedance matching with said antenna.

46. A device according to claim 41, wherein each of said second microwave paths further comprises a microwave power amplifier comprising:

a metal block secured and disposed in said oversized waveguide;

said dielectric substrate secured on said metal block;

a pair of strip conductors formed on the surface of said substrate, one of said strip conductors coupled to said conductor line pattern;

an amplifier element having an input terminal and an output terminal connected to said pair of strip conductors, respectively; and a back surface pattern provided on the back surface of said substrate which comprises a microstrip MIC transmission line together with one of said strip conductors for impedance matching with said amplifier element, at least one end of said back surface pattern being a narrowed end to obtain impedance matching with said antenna.

47. A device according to claim 42, wherein each of said second microwave paths further comprises a microwave power amplifier comprising:

a metal block secured and disposed in said oversized waveguide;

said dielectric substrate secured on said metal block;

a pair of strip conductors formed on the surface of said substrate, one of said strip conductors coupled to said conductor line pattern;

an amplifier element having an input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern being a narrowed end to obtain impedance matching with said antenna.

48. A microwave power amplifier device, comprising:

a first electromagnetic horn having a rectangular cross-section, a throat portion coupled to an input microwave path and an opening portion which radially disperses a microwave input signal;

an oversized rectangular waveguide coupled to the opening portion of said first electromagnetic horn at one end;

a second electromagnetic horn having a rectangular cross-section, an opening portion coupled to the other end of said oversized waveguide and which combines microwave signals from said oversized waveguide;

a plurality of amplifier units in said oversized waveguide, each of said amplifier units receiving and amplifying the microwave signal from said first electromagnetic horn after converting it into an MIC mode signal, and an output signal of each of said amplifier units being transmitted into said second electromagnetic horn after it is converted into a waveguide mode signal;

a planar dielectric substrate on which at least a portion of said amplifier units being formed; and phase compensating means for uniformalizing the phases of the microwave signals distributed by said first electromagnetic horn and adjusting the phases of the microwave signals output from said plurality of amplifier units, said phase compensating means being arranged at one of the coupling portions from said first electromagnetic horn to said oversized waveguide and from said oversized waveguide to said second electromagnetic horn, said phase compensating means comprising a dielectric lens comprising a dielectric substance.

49. A device according to claim 48, wherein aid dielectric lens is disposed at the coupling portion of said first electromagnetic horn and said oversized waveguide.

50. A microwave power amplifier device, comprising:

a first electromagnetic horn having a rectangular cross-section, a throat portion coupled to an input microwave path and an opening portion which radially disperses a microwave input signal;

an oversized rectangular waveguide coupled to the opening portion of said first electromagnetic horn at one end;

a second electromagnetic horn having a rectangular cross-section, an opening portion coupled to the other end of said oversized waveguide and which combines microwave signal from said oversized waveguide;

a plurality of amplifier units in said oversized waveguide, each of said amplifier units receiving and amplifying the microwave signal from said first electromagnetic horn after converting it into an MIC mode signal, and an output signal of each of said amplifier units being transmitted into said second electromagnetic horn after it is converted into a waveguide mode signal;

a planar dielectric substrate on which at least a portion of said amplifier units being formed; and phase compensating means for uniformalizing the phases of the microwave signals distributed by said first electromagnetic horn and adjusting the phases of the microwave signals output from said plurality of amplifier units, said phase compensating means being arranged at one of the coupling portions from said first electromagnetic horn to said oversized waveguide and from said oversized waveguide to said second electromagnetic horn, said phase compensating means comprising one or more reflectors.

51. A device according to claim 50 wherein said reflectors are disposed at the coupling portion between said first or second electromagnetic horn and said oversized waveguide.

52. A device according to claim 51, wherein said phase compensating means comprises two reflectors.

53. A device according to claim 48 or 50, said oversized waveguide has a direction of enlargement, and each of said plurality of amplifier units comprises:

an MIC transmission line; and a waveguide/MIC converting element coupled to said MIC transmission line and disposed within said oversized waveguide, the length of each of said MIC transmission lines varies in accordance with the position of the corresponding waveguide/MIC converting element along the direction of enlargement of said oversized waveguide.

54. A device according to claim 53, wherein said length of said MIC transmission line corresponding to said waveguide/MIC converting element disposed at the central position along the direction of enlargement of said oversized waveguide is largest, and becomes smaller in accordance with its distance from the central position.

55. A device according to claim 53, wherein the positions of said waveguide/MIC converting elements along the propagation path of the microwave signal vary in accordance with the position thereof along the direction of enlargement of said oversized waveguide.

56. A device according to claim 48 or 50, wherein the width of said oversized waveguide varies in accordance with the position along the direction of enlargement of said horn.

57. A device according to claim 56, wherein said width of said oversized waveguide is largest at the central position along the direction of said horn, and becomes smaller in accordance with the distance from the central position.

58. A device according to claim 48 or 50, wherein each of said amplifier units comprises:

said dielectric substrate;

a waveguide/MIC converting element; and an MIC transmission line connected to said waveguide/MIC converting element which is element disposed at an end portion of or within said oversized waveguide, each of said waveguide/MIC converting elements being an MIC dipole antenna formed on the sides of said dielectric substrate.

59. A device according to claim 48 or 50, wherein each of said amplifier units comprises:

said dielectric substrate;

a waveguide/MIC converting element; and an MIC transmission line connected to said waveguide/MIC converting element which element is disposed at an end portion of or within said oversized waveguide, each of said waveguide/MIC converting elements comprising an MIC slot antenna having a slot line portion and formed on one side of said dielectric substrate.

60. A device according to claim 59, wherein each of said waveguide/MIC converting elements further comprises a conductor line pattern formed on the opposite side from said MIC slot antenna formed on said dielectric substrate, said conductor line pattern being formed along a direction perpendicular to the direction of the slot line portion of said MIC slot antenna.

61. A device according to claim 48 or 50, wherein each of said amplifier units comprises a microwave power amplifier comprising:

a metal block secured and disposed in said oversized waveguide;

said dielectric substrate secured on said metal block;

a pair of strip conductors formed on the surface of said substrate;

at least one antenna element formed at an end of at least one of said pair of strip conductors;

an amplifier element having an input terminal and an output terminal connected to said pair of strip conductors, respectively; and a back surface pattern provided on the back surface of said substrate which comprises a microstrip line together with the one of said strip conductors for impedance matching with said amplifier element, at least one end of said back surface pattern being a narrowed end to obtain impedance matching with said antenna.

62. A microwave power amplifier, comprising:

a first electromagnetic horn having a rectangular cross-section, a throat portion coupled to an input microwave path and an opening portion which radially disperses a microwave input signal;

an oversized rectangular waveguide coupled to the opening portion of said first electromagnetic horn at one end;

a second electromagnetic horn having a rectangular cross-section, an opening portion coupled to the other end of said oversized waveguide and which combines microwave signals from said oversized waveguide, a width of said oversized waveguide varying in accordance with a position along a direction of enlargement of said first or second electromagnetic horn;

a plurality of amplifier units in said oversized waveguide, each of said amplifier units receiving and amplifying the microwave signal from said first electromagnetic horn after converting in into an MIC mode signal, and an output signal of each of said amplifier units being transmitted into said second electromagnetic horn after it is converted into a waveguide mode signal; and a planar dielectric substrate on which at least a portion of said amplifier units being formed.

63. A device according to claim 62, wherein the width of said oversized waveguide is largest at the central position along the direction of enlargement of said horn, and becomes smaller in accordance with the distance from the central position.

64. A device according to claim 62 or 63, wherein said oversized waveguide has a waveguide direction of enlargement and each of said plurality of amplifier units comprises:

an MIC transmission line; and a waveguide/MIC converting element coupled to said MIC transmission line and disposed within said oversized waveguide, the length of each of said MIC transmission lines varies in accordance with the position of the corresponding waveguide/MIC converting element along the waveguide direction of enlargement of said oversized waveguide.

65. A device according to claim 64, wherein the length of said MIC transmission line corresponding to the waveguide MIC converting element disposed at a central position along the waveguide direction of enlargement of said oversized waveguide is the largest, and said length becomes smaller as the distance from the central position becomes large.

66. A device according to claim 63 or 64, wherein said oversized waveguide has a waveguide direction of enlargement, and the positions of said waveguide/MIC converting elements along the propagation path of the microwave signal vary in accordance with the position thereof along the direction of enlargement of said oversized waveguide.

67. A device according to claim 62 or 63, wherein each of said amplifier units comprises:

said dielectric substrate;

a waveguide/MIC converting element; and an MIC transmission line connected to said waveguide/MIC converting element which element is disposed within said oversized waveguide, each of said waveguide/MIC converting elements comprising an MIC dipole antenna formed on the sides of said dielectric substrate.

68. A device according to claim 62 or 63, wherein each of said amplifier units comprises:

said dielectric substrate;

a waveguide/MIC converting element; and an MIC transmission line connected to said waveguide/MIC converting element which element is disposed at the end portion of or within said oversized waveguide, each of said waveguide/MIC converting elements comprising an MIC slot antenna formed on one side of said dielectric substrate.

69. A device according to claim 68, wherein said MIC slot antenna has a slot line portion, and each of said waveguide/MIC converting elements further comprise a conductor line pattern formed on the opposite side from said MIC slot antenna formed on said dielectric substrate, said conductor line pattern being formed along a direction perpendicular to the direction of the slot line portion of said MIC slot antenna.

70. A device according to claim 62 or 63, wherein each of said amplifier units comprises a microwave power amplifier comprising:

a metal block secured and disposed in said oversized waveguide;

said dielectric substrate secured on said metal block;

a pair of strip conductors formed on the surface of said substrate;

at least one antenna element formed at the end of at least one of said pair of strip conductors;

an amplifier element having an input terminal and an output terminal connected to said pair of strip conductors, respectively; and a back surface pattern provided on the back surface of said substrate which comprises a microstrip line together with the one of said strip conductors for impedance matching with said amplifier element, at least one end of said back surface pattern being a narrowed end to obtain impedance matching with said antenna.

71. A microwave power amplifier, comprising:

a first electromagnetic horn having a rectangular cross-section, a throat portion coupled to an input microwave path and an opening portion which radially disperses a microwave input signal;

an oversized rectangular waveguide having a width, length and height, having a direction of enlargement along the height, and coupled to the opening portion of said first electromagnetic horn at one end, including path waveguides therein, a width of each of said path waveguides varying in accordance with its position along the height direction of said oversized waveguide;

a second electromagnetic horn having a rectangular cross-section, an opening portion coupled to the other end of said over sized waveguide and which combines microwave signals from said oversized waveguide;

a plurality of amplifier units each in one of said path waveguides, each of said amplifier units receiving and amplifying the microwave signal from said first electromagnetic horn after converting it into an MIC mode signal, and the output signal of each of said amplifier units being transmitted into said second electromagnetic horn after it is converted into a waveguide mode signal; and a planar dielectric substrate on which at least a portion of said amplifier units being formed.

72. A device according to claim 71, wherein the width of each path waveguide of said amplifier unit is largest at the central position along the direction of enlargement of said oversized waveguide, and becomes smaller in accordance with the distance from the central position.

73. A device according to claim 71 or 72, wherein each of said amplifier units comprises:

said dielectric substrate;

a waveguide/MIC converting element; and an MIC transmission line connected to said waveguide/MIC converting element which element is disposed in the corresponding path waveguide, each of said waveguide/MIC converting elements comprising an MIC dipole antenna formed on the sides of said dielectric substrate.

74. A device according to claim 71 or 72, wherein each of said amplifier units comprises:

said dielectric substrate;

a waveguide/MIC converting element; and an MIC transmission line connected to a waveguide/MIC converting element which element is disposed in the corresponding path waveguide, each of said waveguide/MIC converting elements comprising an MIC slot antenna formed on one side of said dielectric substrate.

75. A device according to claim 74, wherein said MIC slot antenna has a slot line portion, and each of said waveguide/MIC converting elements further comprises a conductor line pattern formed on the opposite side from said MIC slot antenna formed on said dielectric substrate, said conductor line pattern being formed along a direction perpendicular to a direction of the slot line portion of said MIC slot antenna.

76. A device according to claim 71 or 72, wherein each of said amplifier units comprises a microwave power amplifier comprising:

a metal block secured and disposed in the corresponding path waveguide;

said dielectric substrate secured on said metal block;

a pair of strip conductors formed on the surface of said substrate;

at least one antenna element formed at the end of at least one of said pair of strip conductors;

an amplifier element having an input terminal and an output terminal connected to said pair of strip conductors, respectively; and a back surface pattern provided on the back surface of said substrate which comprises a microstrip line together with the one of said strip conductors for impedance matching with said amplifier element, at least one end of said back surface pattern being a narrowed end to obtain impedance matching with said antnna.

77. A device according to claim 53, wherein said horn has a direction of enlargement, and the width of said oversized waveguide varies in accordance with a position along the direction of enlargement of said horn.

78. A device according to claim 55, wherein said horn has a direction of enlargement, and the width of said oversized waveguide varies in accordance with position along the direction of enlargement of said horn.

79. A device according to claim 53, wherein each of said amplifier units further comprises said dielectric substrate and each of said waveguide/MIC converting elements comprises an MIC slot antenna formed on one side of said dielectric substrate and a conductor line pattern formed on the opposite side from said MIC slot antenna formed on said dielectric substrate, and formed along the direction perpendicular to the direction of a slot line portion of said MIC slot antenna.

80. A device according to claim 55, wherein each of said amplifier units further comprises said dielectric substrate and each of said waveguide/MIC converting elements comprises an MIC slot antenna formed on one side of said dielectric substrate and a conductor line pattern formed on the opposite side from said MIC slot antenna formed on said dielectric substrate, and formed along a direction perpendicular to a direction of the slot line portion of said MIC slot antenna.

81. A device according to claim 53, wherein each of said amplifier units further comprises a microwave power amplifier comprising:

a metal block secured and disposed in said oversized waveguide;

said dielectric substrate secured on said metal block;

a pair of strip conductors formed on the surface of said substrate, one of said strip conductors forming part of said MIC transmission line;

at least one antenna element formed at the end of at least one of said pair of strip conductors, said antenna element forming said waveguide/MIC converting element;

an amplifier element having an input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern being a narrowed end to obtain impedance matching with said antenna.

82. A device according to claim 55, wherein each of said amplifier units further comprises a microwave power amplifier comprising:

a metal block secured and disposed in said oversized waveguide;

said dielectric substrate secured on said metal block;

a pair of strip conductors formed on the surface of said substrate, one of said strip conductors forming part of said MIC transmission line;

at least one antenna element formed at the end of at least one of said pair of strip conductors, said antenna element forming said waveguide/MIC converting element;

an amplifier element having an input terminal and an output terminal connected to said pair of strip conductors, respectively; and a back surface pattern provided on the back surface of said substrate which comprises a microstrip MIC transmission line together with said strip conductor for impedance matching with said amplifier element, at least one end of said back surface pattern being a narrowed end to obtain impedance matching with said antenna.

83. A device according to claim 56, wherein each of said amplifier units comprises:

said dielectric substrate;

a waveguide/MIC converting element; and an MIC transmission line connected to said waveguide/MIC converting element which element is disposed within said oversized waveguide, each of said waveguide/MIC converting elements comprising an MIC slot antenna formed on one side of said dielectric substrate, and a conductor line pattern formed on the opposite side from said MIC slot antenna formed on said dielectric substrate, and formed along a direction perpendicular to the direction of a slot line portion of said MIC slot antenna.

84. A device according to claim 56, wherein each of said amplifier units comprises a microwave power amplifier comprising:

a metal block secured and disposed in said oversized waveguide;

said dielectric substrate secured on said metal block;

a pair of strip conductors formed on the surface of said substrate;

at least one antenna element formed at the end of at least one of said pair of strip conductors;

an amplifier element having an input terminal and an output terminal connected to said pair of strip conductors, respectively; and a back surface pattern provided on the back surface of said substrate which comprises a microstrip line together with said strip conductor for impedance matching with said amplifier element, at least one end of said back surface pattern being a narrowed end to obtain impedance matching with said antenna.

85. A device according to claim 60, wherein each of said amplifier units further comprises a microwave power amplifier comprising:

a metal block secured and disposed in said oversized waveguide;

said dielectric substrate secured on said metal block;

a pair of strip conductors formed on the surface of said substrate, one of said strip line conductors coupled to said conductor line pattern;

at least one antenna element formed at the end of at least one of said pair of strip conductors, said antenna element forming said MIC slot antenna;

an amplifier element having an input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern being a narrowed end to obtain impedance matching with said antenna.

86. A device according to claim 69, wherein each of said amplifier units further comprises a microwave power amplifier comprising:

a metal block secured and disposed in said oversized waveguide;

said dielectric substrate secured on said metal block;

a pair of strip conductors formed on the surface of said substrate, one of said strip conductors coupled to said conductor line pattern;

at least one antenna element formed at the end of at least one of said pair of strip conductors, said antenna element forming said waveguide/MIC converting element;

an amplifier element having an input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern being a narrowed end to obtain impedance matching with said antenna.

87. A device according to claim 75, wherein each of said amplifier units further comprises a microwave power amplifier comprising:

a metal block secured and disposed in said oversized waveguide;

said dielectric substrate secured on said metal block;

a pair of strip conductors formed on the surface of said substrate, said antenna element forming said MIC slot antenna;

an amplifier element having an input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern being a narrowed end to obtain impedance matching with said antenna.

88. A device according to claim 77, wherein each of said amplifier units further comprises said dielectric substrate and each of said waveguide/MIC converting elements comprises an MIC slot antenna formed on one side of said dielectric substrate and a conductor line pattern formed on the opposite side from said MIC slot antenna formed on said dielectric substrate, and formed along the direction perpendicular to the direction of a slot line portion of said MIC slot antenna.

89. A device according to claim 78, wherein each of said amplifier units further comprises said dielectric substrate and each of said waveguide/MIC converting elements comprises an MIC slot antenna formed on one side of said dielectric substrate and a conductor line pattern formed on the opposite side from said MIC slot antenna formed on said dielectric substrate, and formed along the direction perpendicular to the direction of a slot line portion of said MIC slot antenna.

90. A device according to claim 79, wherein each of said amplifier units further comprises a microwave power amplifier comprising:

a metal block secured and disposed in said oversized waveguide;

said dielectric substrate secured on said metal block;

a pair of strip conductors formed on the surface of said substrate, one of said strip conductors coupled to said conductor line pattern;

at least one antenna element formed at the end of at least one of said pair of strip conductors, said antenna element forming said MIC slot antenna;

an amplifier element having an input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern being a narrowed end to obtain impedance matching with said antenna.

91. A device according to claim 80, wherein each of said amplifier units further comprises a microwave power amplifier comprising:

a metal block secured and disposed in said oversized waveguide;

said dielectric substrate secured on said metal block;

a pair of strip conductors formed on the surface of said substrate, one of said strip conductors coupled to said conductor line pattern;

at least one antenna element formed at the end of at least one of said pair of strip conductors, said antenna element forming said MIC slot antenna;

an amplifier element having an input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern being a narrowed end to obtain impedance matching with said antenna.

92. A device according to claim 77, wherein each of said amplifier units further comprises a microwave power amplifier comprising:

a metal block secured and disposed in said oversized waveguide;

said dielectric substrate secured on said metal block;

a pair of strip conductors formed on the surface of said substrate, one of said strip conductors coupled to said conductor line pattern;

at least one antenna element formed at the end of at least one of said pair of strip conductors, said antenna element forming said MIC slot antenna;

an amplifier element having an input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern being a narrowed end to obtain impedance matching with said antenna.

93. A device according to claim 88, wherein each of said amplifier units further comprises a microwave power amplifier comprising:

metal block secured and disposed in said oversized waveguide;

said dielectric substrate secured on said metal block;

a pair of strip conductors formed on the surface of said substrate, one of said strip conductors coupled to said conductor line pattern;

at least one antenna element formed at the end of at least one of said pair of strip conductors, said antenna element forming said MIC slot antenna;

an amplifier element having a input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern being a narrowed end to obtain impedance matching with said antenna.

94. A device according to claim 89, wherein each of said amplifier units further comprises a microwave power amplifier comprising:

a metal block secured and disposed in said oversized waveguide;

said dielectric substrate secured on said metal block;

a pair of strip conductors formed on the surface of said substrate, one of said strip conductors coupled to said conductor line pattern;

at least one antenna element formed at the end of at least one of said pair of strip conductors, said antenna element forming said MIC slot antenna;

an amplifier element having an input terminal and an output terminal connected to said pair of strip conductors, respectively; and a back surface pattern provided on the back surface of said substrate which comprises a microstrip MIC transmission line together with the one of said strip conductors for impedance matching with said amplifier element, at least one end of said back surface pattern being a narrowed end to obtain impedance matching with said antenna.

95. A microwave device, comprising:

a first electromagnetic horn for transmitting a microwave signal and having a rectangular cross-section;

an oversized rectangular waveguide coupled to said first horn;

means for adjusting the phase of the microwave signal located at the coupling between said first electromagnetic horn and said oversized waveguide, said means for adjusting comprising a dielectric lens; and amplifying means, mounted in said oversized waveguide, for amplifying the microwave signal, said amplifying means comprising:

a planar dielectric substrate;

an amplifier mounted in said dielectric substrate; and an antenna coupled to said amplifier and comprising conductive patterns on said dielectric substrate.

96. A microwave device, comprising:

a first electromagnetic horn for transmitting a microwave signal and having a rectangular cross-section;

an oversized rectangular waveguide coupled to said first horn;

means for adjusting the phase of the microwave signal located at the coupling between said first electromagnetic horn and said oversized waveguide, said means for adjusting comprising a reflector; and amplifying means, mounted in said oversized waveguide, for amplifying the microwave signal, said amplifying means comprising:

a planar dielectric substrate;

an amplifier mounted in said dielectric substrate; and an antenna coupled to said amplifier and comprising conductive patterns on said dielectric substrate.

97. A device according to claim 95, wherein said antenna is a dipole antenna.

98. A device according to claim 95, wherein said antenna is a slot antenna.

99. A device according to claim 95, wherein said means for adjusting is located in said oversized waveguide.

100. A microwave device, comprising:

a first electromagnetic horn for transmitting a microwave signal and having a rectangular cross-section;

an oversized rectangular waveguide coupled to said first horn;

means for adjusting the phase and the power of the microwave signal and located in said oversized waveguide, said means for adjusting comprising a planar dielectric substrate, antennas formed on said substrate, conductors formed on said substrate and coupled to corresponding antennas at fixed positions within said oversized waveguide, and amplifiers mounted in said substrate and coupled to corresponding conductors, where the relative length of each conductor decreases as its relative position approaches a wall of said oversized waveguide.

101. A device according to claim 100, wherein the relative position of each of said antennas along the propagation path of the microwave signal varies as the relative position of each of said antennas approaches the wall of said oversized waveguide.

102. A device according to claim 100, wherein said means for adjusting further comprises a dielectric substrate, said amplifiers being mounted in said dielectric substrate, and said antennas and conductors comprising conductive patterns on said dielectric substrate.

103. A device according to claim 100, 101 or 102, wherein said antenna is a dipole antenna.

104. A device according to claim 100, 101 or 102, wherein said antenna is a slot antenna.

105. A device according to claim 99, wherein said oversized waveguide has a direction of enlargement and a width that varies along the direction of enlargement.

106. A device according to claim 105, wherein the width decreases as the direction of enlargement approaches a wall of said oversized waveguide.

107. A device according to claim 105 or 106, wherein said means for adjusting comprises path waveguides mounted in said oversized waveguide at fixed positions, where a relative width of each path waveguide decreases as the relative position of the path waveguide approaches the wall along the direction of enlargement.

108. A device according to claim 107, wherein each path waveguide comprises an antenna and an amplifier coupled to said antenna.

109. A device according to claim 108, wherein each path waveguide further comprises a conductor and an impedance matching conductor both coupled between said antenna and said amplifier.

110. A device according to claim 109, wherein each path waveguide further comprises a dielectric substrate, said antenna, said conductor and said impedance matching conductor formed as conductive patterns on said dielectric substrate, and said amplifier being mounted in said dielectric substrate.

111. A device according to claim 95, further comprising a second electromagnetic horn coupled to said oversized waveguide.

112. A device for distributing and combining microwave power, comprising:

a first microwave path;

second microwave paths each including an MIC transmission line, a waveguide/MIC converting element coupled to said MIC transmission line and a planar dielectric substrate on which at least a portion of said second microwave paths being formed;

an electromagnetic horn having a rectangular cross-section, a throat portion coupled to said first microwave path and an opening portion for transmitting a microwave signal; and an oversized rectangular waveguide coupled to the opening portion of said horn at one end, the other end of said oversized waveguide being coupled to said plurality of second microwave paths, said second microwave paths being disposed within said oversized waveguide, a length of each said MIC transmission line varying in accordance with the position of the corresponding waveguide/MIC converting element along a direction of enlargement of said oversized waveguide, the length of said MIC transmission line corresponding to said converting element disposed at the central position along the direction of enlargement of said oversized waveguide being the largest, and the length becoming smaller as the distance from the central portion increases.

113. A microwave power amplifier, comprising:

a first microwave path;

second microwave paths each including an MIC transmission line, a waveguide/MIC converting element coupled to said MIC transmission line and a planar dielectric substrate on which at least a portion of said second microwave paths being formed;

a first electromagnetic horn having a rectangular cross-section, a throat portion coupled to said first microwave path and an opening portion which radially disperses a microwave input signal;

an oversized rectangular waveguide coupled to the opening portion of said first electromagnetic horn at one end, said second microwave paths being disposed within said oversized waveguide, a length of each said MIC transmission line varying in accordance with the position of the corresponding waveguide/MIC converting element along a direction of enlargement of said oversized waveguide, the length of said MIC transmission line corresponding to said converting element disposed at a central position along the direction of enlargement of said oversized waveguide being the largest, and the length becoming smaller as the distance from the central position increases;

a second electromagnetic horn having a rectangular cross-section, an opening portion coupled to the other end of said oversized waveguide and which combines microwave signals from said oversized waveguide; and a plurality of amplifier units mounted in said dielectric substrate in said oversized waveguide, each of said amplifier units receiving and amplifying the microwave signal from said first electromagnetic horn after converting in into an MIC mode signal, and an output signal of each of said amplifier units being transmitted into said second electromagnetic horn after it is converted into a waveguide mode signal.

* * * * *

UNITED STATES PATENT AND TRADEMARK OFFICE

CERTIFICATE OF CORRECTION

PATENT NO. : 4,588,962 Page 1 of 2

DATED : May 13, 1986

INVENTOR(S) : TOSHIYUKI SAITO ET AL.

It is certified that error appears in the above-identified patent and that said Letters Patent is hereby corrected as shown below:

[57] ABSTRACT, line 9, "a" should be --an--.

Col. 2, line 46, "invnetion" should be --invention--.

Col. 3, line 30, "planee" should be --plane--.

Col. 4, line 1, delete "a, in".

Col. 10, line 31, "blanced to unbalanced" should be --balanced-to-unbalanced--;

line 32, "graduaaly" should be --gradually--.

Col. 12, line 40, "a decrease with" should be --decreases with--.

Col. 14, line 40, "and" should be --the--.

UNITED STATES PATENT AND TRADEMARK OFFICE
CERTIFICATE OF CORRECTION

PATENT NO. : 4,588,962 Page 2 of 2
DATED : May 13, 1986
INVENTOR(S) : TOSHIYUKI SAITO ET AL.

It is certified that error appears in the above-identified patent and that said Letters Patent is hereby corrected as shown below:

Col. 26, line 27, "aid" should be --a--.

Col. 27, line 5, after "50," insert --wherein--;

Col. 28, line 37, "in" should be --it--.

Col. 38, line 31, [line numbering is off];
"in" should be --it--.

Signed and Sealed this

*Ninth* Day of *September 1986*

[SEAL]

*Attest:*

DONALD J. QUIGG

*Attesting Officer* *Commissioner of Patents and Trademarks*